United States Patent [19]

Niimura

[11] Patent Number: 5,126,846
[45] Date of Patent: Jun. 30, 1992

[54] NON-LINEAR AMPLIFIER AND NON-LINEAR EMPHASIS/DEEMPHASIS CIRCUIT USING THE SAME

[75] Inventor: Kazuharu Niimura, Fukaya, Japan

[73] Assignee: Kabushiki Kaisha Toshiba, Kawasaki, Japan

[21] Appl. No.: 388,640

[22] Filed: Aug. 2, 1989

[30] Foreign Application Priority Data

| | | | |
|---|---|---|---|
| Aug. 8, 1988 | [JP] | Japan | 63-196140 |
| Sep. 13, 1988 | [JP] | Japan | 63-229011 |
| Oct. 31, 1988 | [JP] | Japan | 63-272913 |
| Nov. 22, 1988 | [JP] | Japan | 63-295422 |

[51] Int. Cl.$^5$ ............................. H04M 5/213
[52] U.S. Cl. ............... 358/167; 358/330; 358/340; 307/490; 328/145
[58] Field of Search ......... 350/160, 184; 307/490, 307/492; 328/145; 360/67, 68, 30, 33.1, 65; 358/166, 167, 315, 330, 340; 369/88

[56] References Cited

U.S. PATENT DOCUMENTS

| | | | |
|---|---|---|---|
| 3,136,848 | 6/1964 | Woodworth | 358/184 |
| 3,790,819 | 2/1974 | Chamran | 328/145 |
| 3,944,853 | 3/1976 | Cooper | 360/67 |
| 3,992,622 | 11/1976 | Numata et al. | 328/145 |
| 4,065,682 | 12/1977 | Evans | 328/145 |
| 4,096,513 | 6/1978 | Ross | 358/330 |
| 4,198,650 | 4/1980 | Hongu et al. | 358/315 |
| 4,290,082 | 9/1981 | Harai | 360/33.1 |
| 4,418,317 | 11/1983 | Bateman | 307/492 |
| 4,451,746 | 5/1984 | Hirose et al. | 358/340 |
| 4,612,585 | 9/1986 | Takase et al. | 358/316 |
| 4,636,655 | 1/1987 | Nagano | 307/490 |
| 4,668,988 | 5/1987 | Sasaki et al. | 358/166 |
| 4,786,970 | 11/1988 | Moore | 358/184 |
| 4,891,603 | 1/1990 | Oda | 307/492 |
| 4,933,641 | 6/1990 | Hsiung et al. | 307/492 |

FOREIGN PATENT DOCUMENTS

| | | |
|---|---|---|
| 0015499 | 9/1980 | European Pat. Off. |
| 48-41044 | 12/1973 | Japan |
| 1432764 | 4/1976 | United Kingdom |

OTHER PUBLICATIONS

"Four-hour Record VHS System VTR Signal Processing", National Technical Report vol. 25 No. 1 Feb. 1979; pp. 76-79.

IEEE 1988 Microwave and Millimeterwave, Monolithic Circuits Symposium, Digest of Papers; New York, 24th-25th 1988, pp. 41-45, IEEE, New York, U.S.; A. K. Oki et al.; "High-performance GaAs heterojunction bipolar transistor etc.".

Patent Abstracts of Japan, vol. 10, No. 213 (E-422) (2269), Jul. 25, 1986; & JP-A-61 052 081 (Ricoh Co. Ltd.) Mar. 14, 1986.

Patent Abstracts of Japan, vol. 9, No. 302 (E-362) (2025), Nov. 29, 1985; & JP-A-60 140 932 (Sony K.K.) Jul. 25, 1985.

J. G. Graeme et al.; "Operational amplifiers design and applications", 1971 pp. 266-269, parts 1, 2, McGraw-Hill Book, Co., New York.

U. Tietze et al.; "Halbleiter-Schaltungstechnik", 5th edition, 1980, pp. 206-211, Springer-Verlag Berlin, DE.

Fequenz, vol. 39, No. 11, Nov. 1985, pp. 298-306, Berlin, DE; A. Glasmachers: "Entwurf und Realisierung Schneller Logarithmierverstärker etc.".

*Primary Examiner*—John W. Shepperd
*Assistant Examiner*—Michael D. Parker
*Attorney, Agent, or Firm*—Oblon, Spivak, McClelland, Maier & Neustadt

[57] ABSTRACT

A non-linear amplifier circuit comprises a low band eliminating filter for receiving an input signal from an input terminal, a logarithmic amplifier and an adder for adding the output signal of this logarithmic amplifier and the input signal with a predetermined polarity relationship to produce an output signal and sending this output signal to an output terminal. The logarithmic amplifier comprises an amplifier for receiving the output signal of the low band eliminating filter, a bidirectional logarithmic element and a resistor coupled in parallel thereto between the input and output terminals of the amplifier.

8 Claims, 28 Drawing Sheets

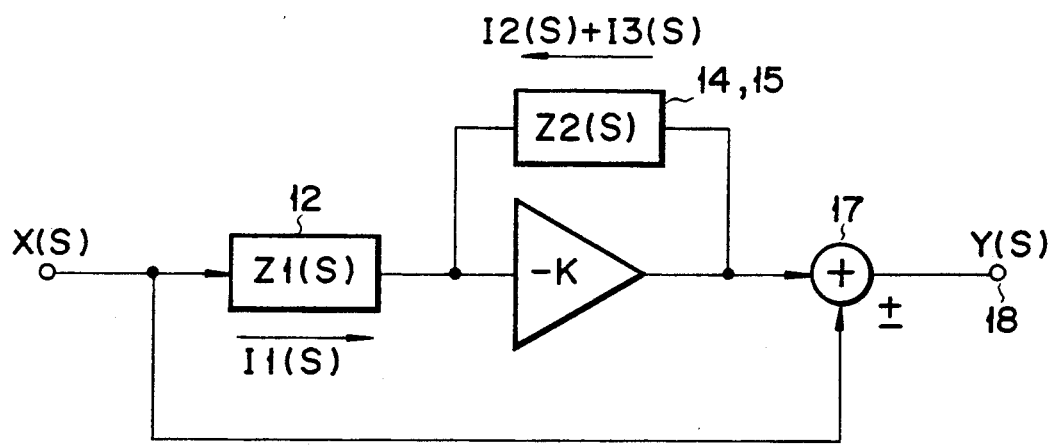
F I G. 6
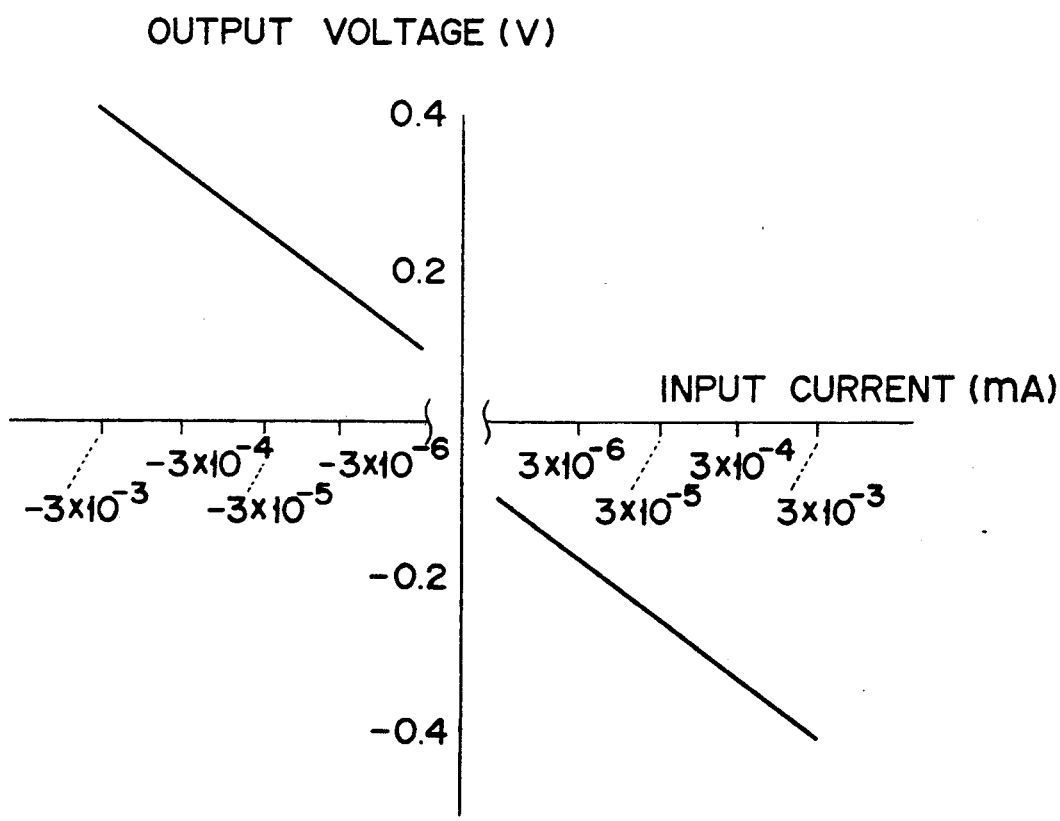
F I G. 7

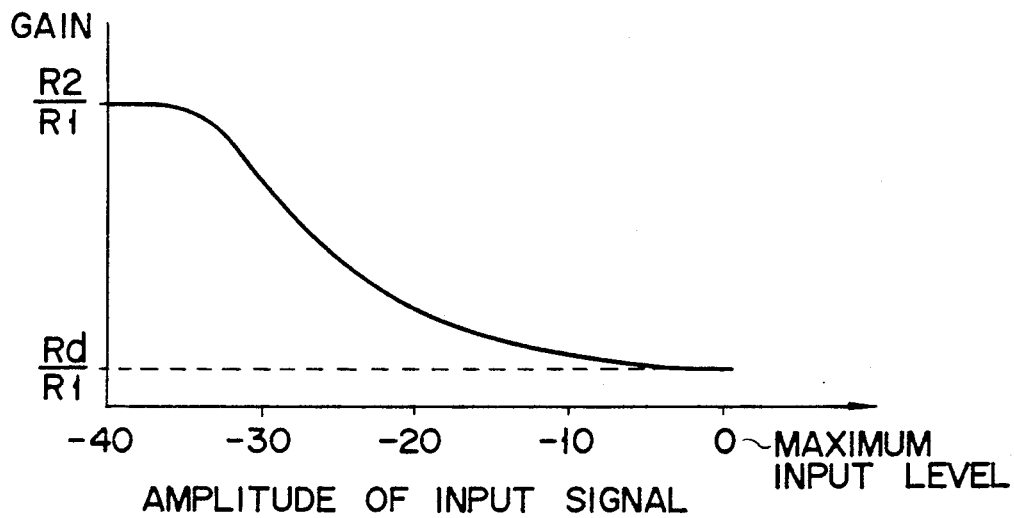
F I G. 8
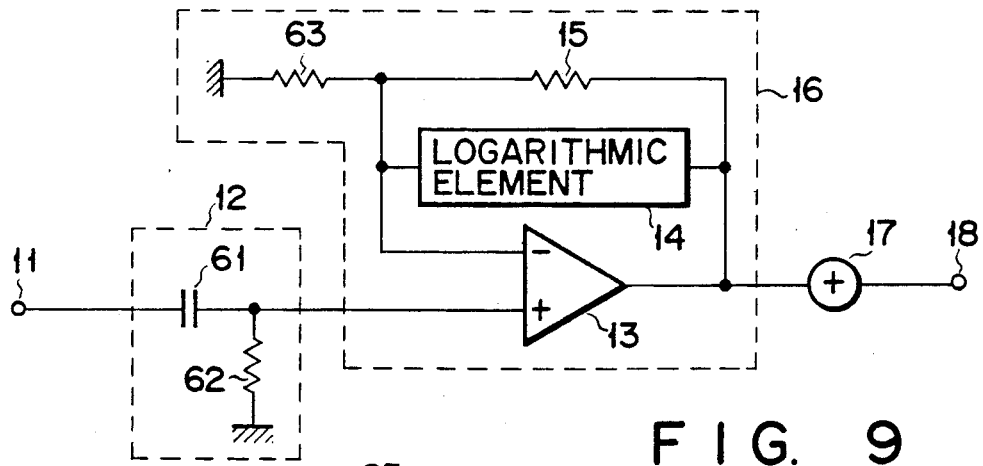
F I G. 9
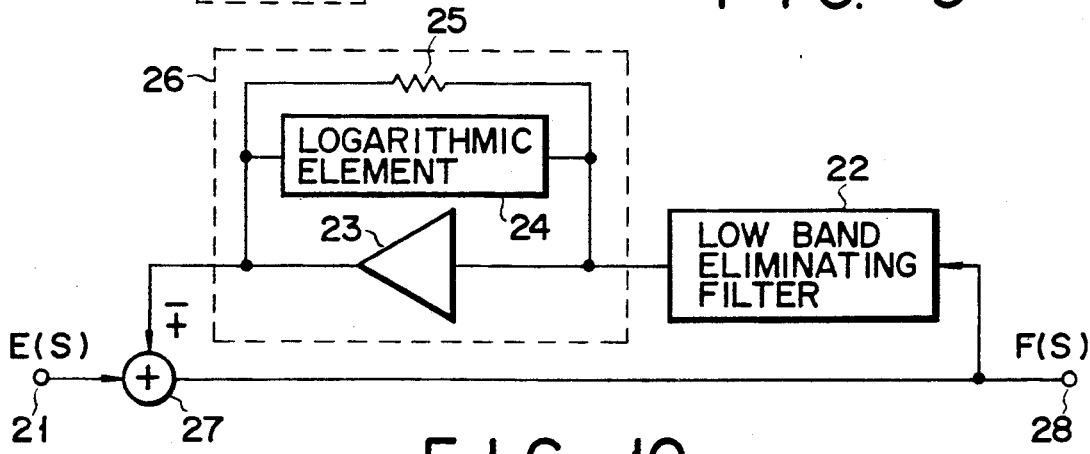
F I G. 10

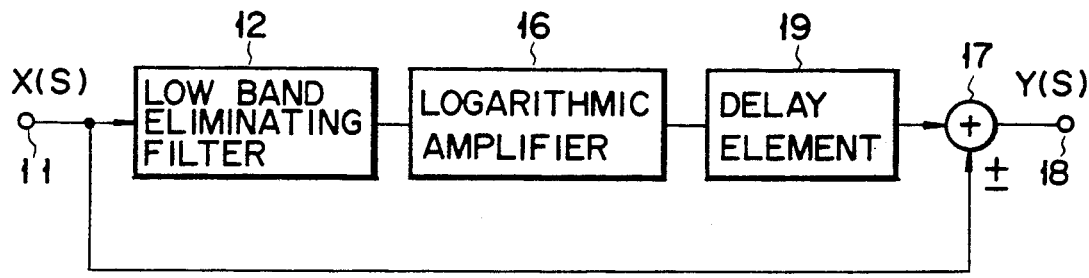
F I G. 11
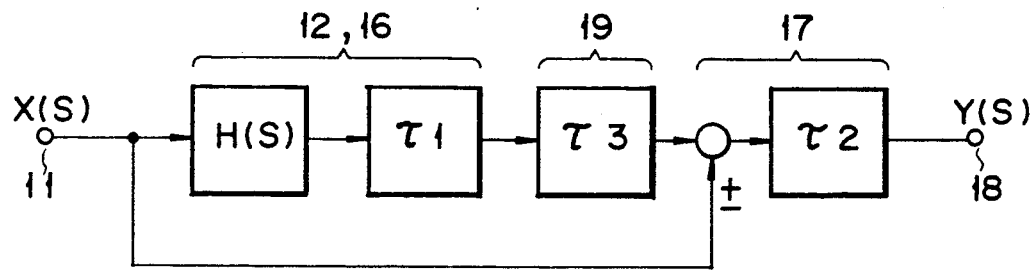
F I G. 12
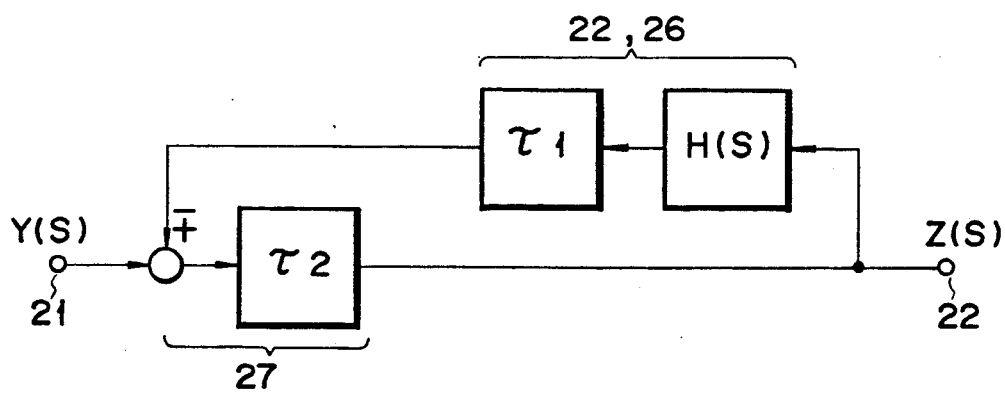
F I G. 13

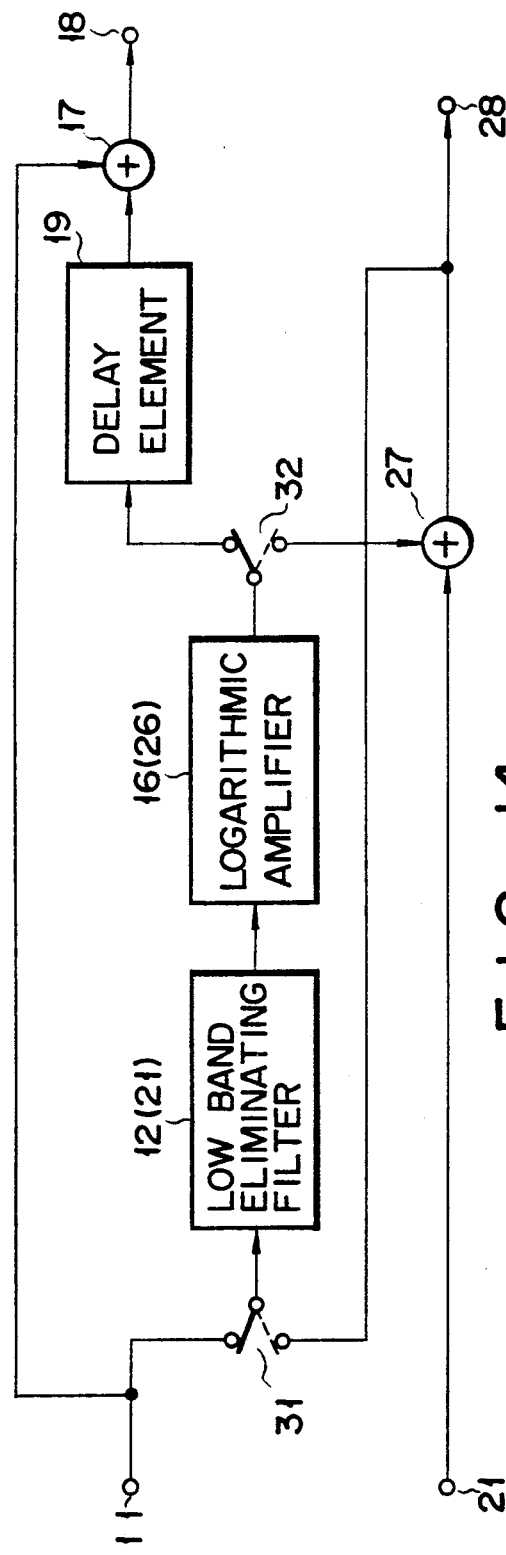
F I G. 14
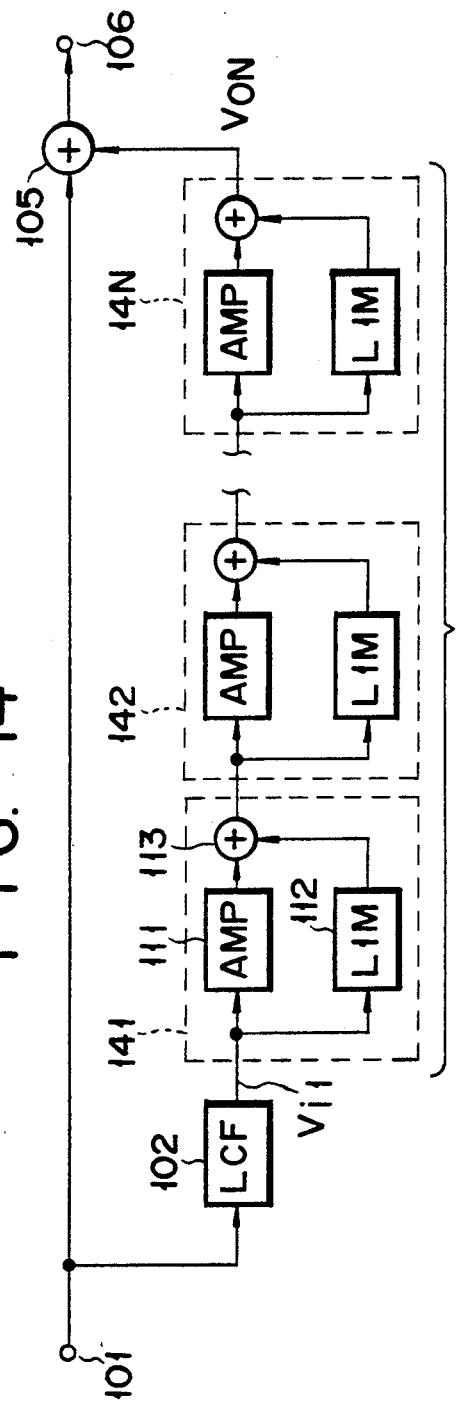
F I G. 15

| Vii | VON |
|---|---|
| $\dfrac{VL}{(1+\ell)^N}$ | $\dfrac{VL}{(1+\ell)^N} \cdot (1+\ell)^N = VL$ |
| $\dfrac{VL}{(1+\ell)^{N-1}}$ | $VL + \dfrac{VL}{(1+\ell)^{N-1}} \cdot (1+\ell)^{N-1} = 2VL$ |
| ⋮ | ⋮ |
| $\dfrac{VL}{(1+\ell)^I}$ | $VL \cdot (N-I) + \dfrac{VL}{(1+\ell)^I} \cdot (\ell+1)^I = (N+1-I) \cdot VL$ |
| ⋮ | ⋮ |
| $\dfrac{VL}{1+\ell}$ | $VL \cdot (N-I) + \dfrac{VL}{1+\ell} \cdot (1+\ell) = N \cdot VL$ |

| $V_i$ | $V_o$ | |
|---|---|---|
| $\dfrac{V_L}{1+\ell+\cdots+\ell^N}$ | $(1+\ell+\cdots+\ell)\cdot\dfrac{V_L}{1+\ell+\cdots+\ell^N}$ | $= V_L$ |
| $\dfrac{V_L\cdot\ell}{1+\ell+\cdots+\ell^N}$ | $(1+\ell+\cdots+\ell^{N-1})\cdot\dfrac{V_L\cdot\ell}{1+\ell+\cdots+\ell^N} + V_L \doteq 2V_L$ | |
| ⋮ | | |
| $\dfrac{V_L\cdot\ell^I}{1+\ell+\cdots+\ell^N}$ | $(1+\ell+\cdots+\ell^{N-I})\cdot\dfrac{V_L\cdot\ell^I}{1+\ell+\cdots+\ell^N} + V_L\cdot(I-1) \doteq IV_L$ | |
| ⋮ | | |
| $\dfrac{V_L\cdot\ell^N}{1+\ell+\cdots+\ell^N}$ | $1\times\dfrac{V_L\cdot\ell^N}{1+\ell+\cdots+\ell^N} + (N-1)V_L \doteq NV_L$ | |

FIG. 20

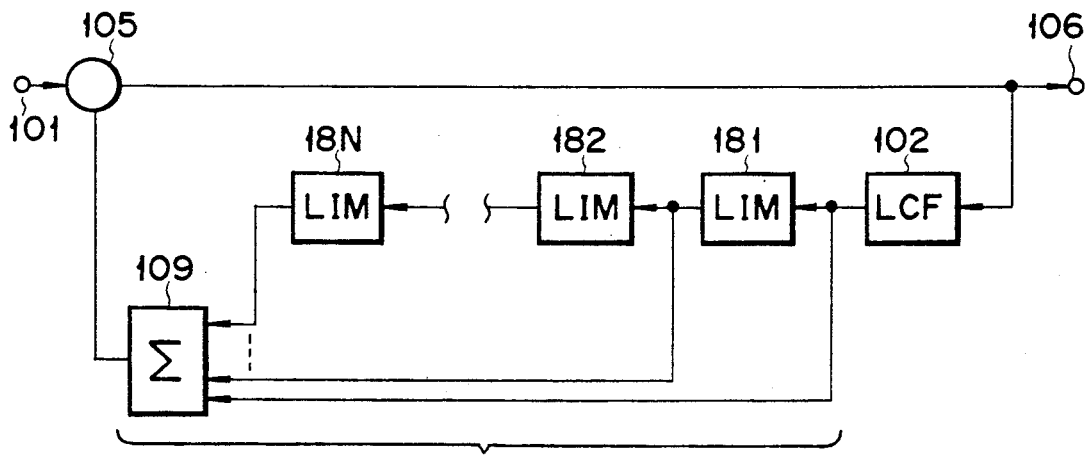

FIG. 21

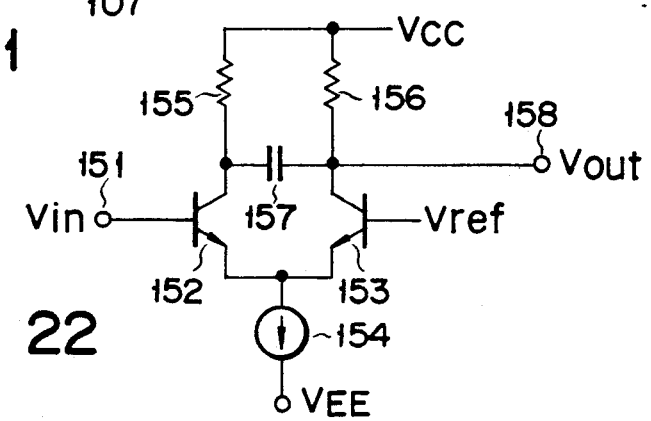

FIG. 22

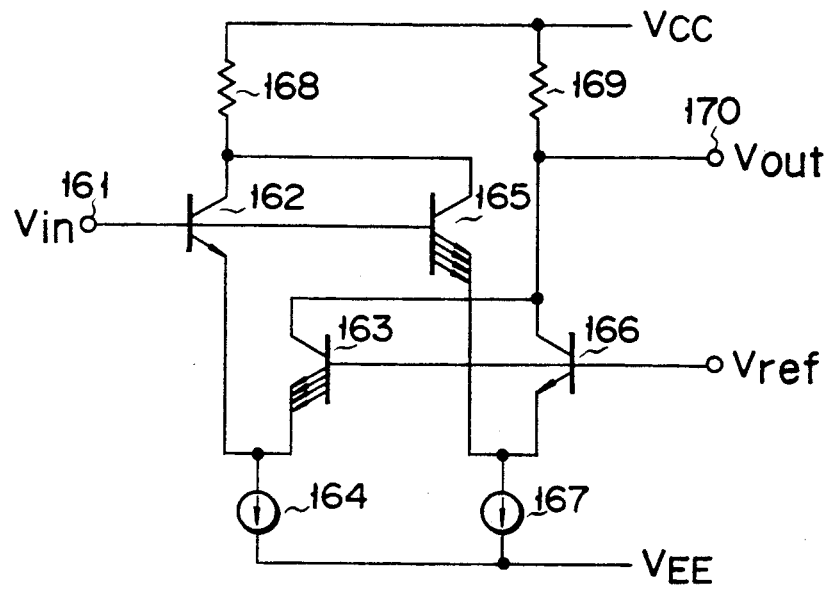
F I G. 23
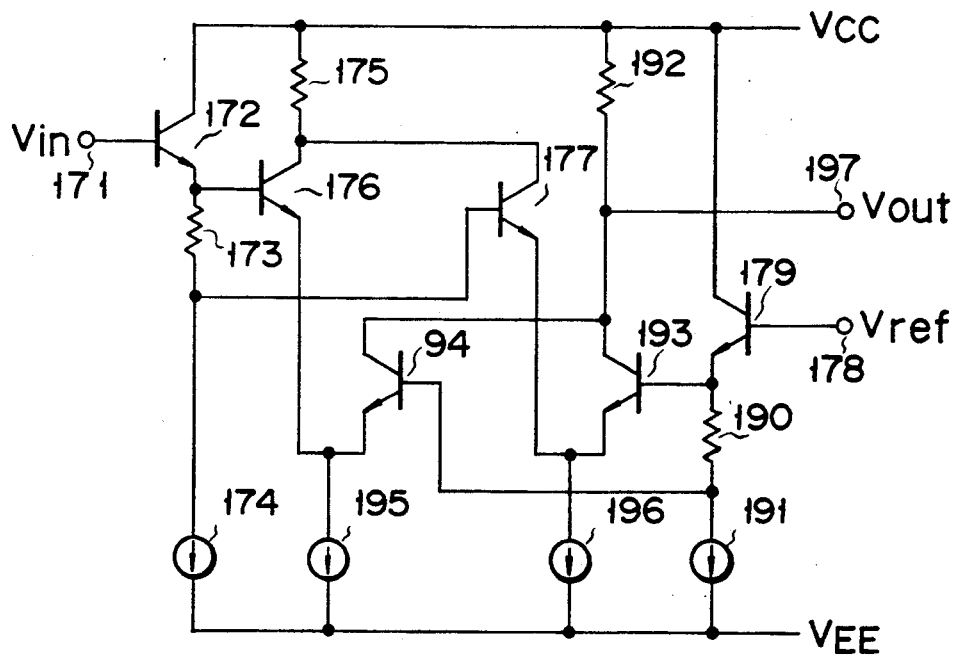
F I G. 24

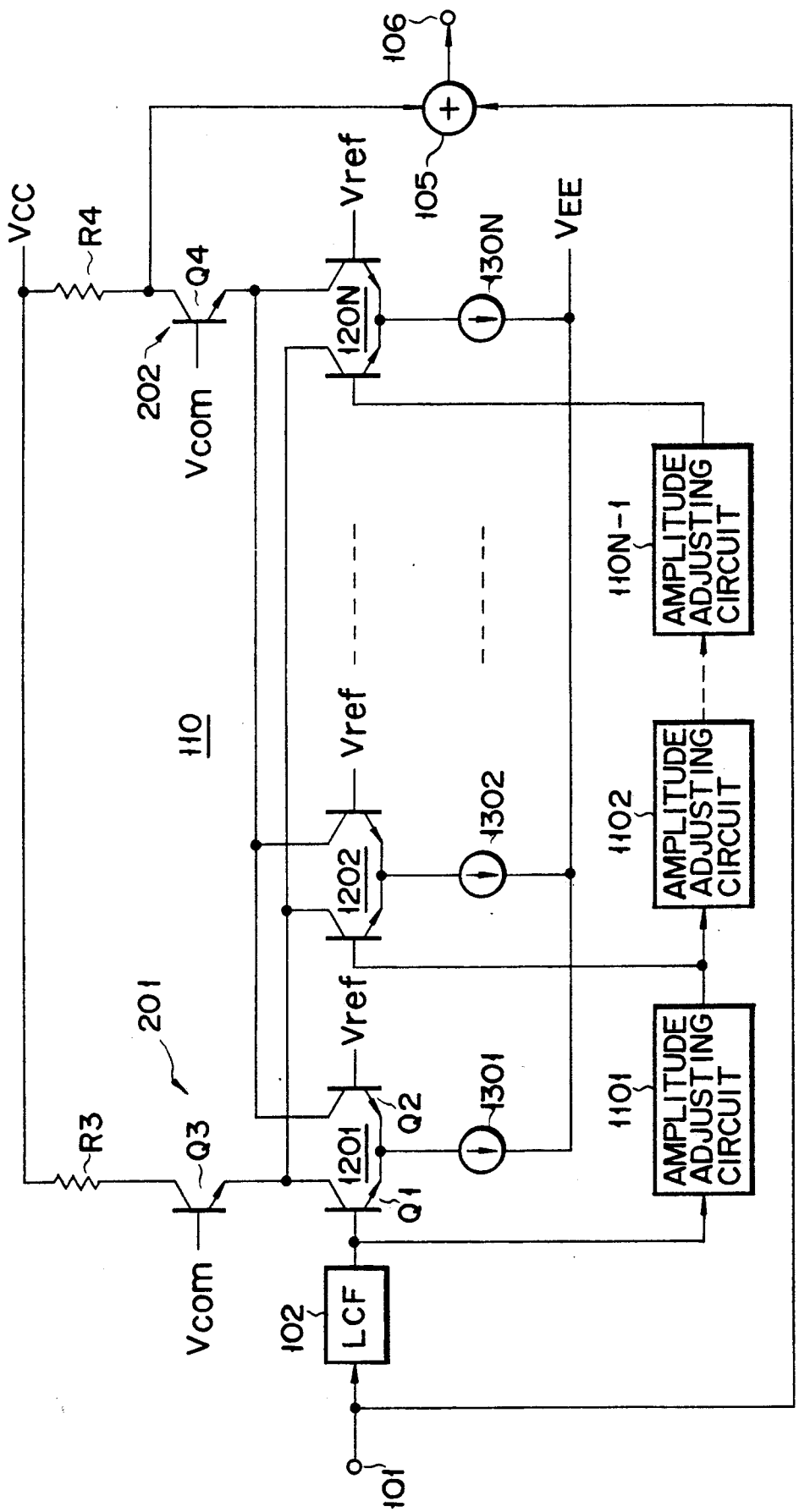
F I G. 25

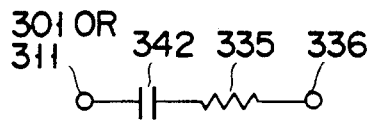
F I G. 34
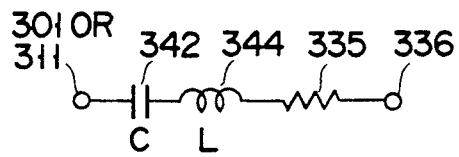
F I G. 35
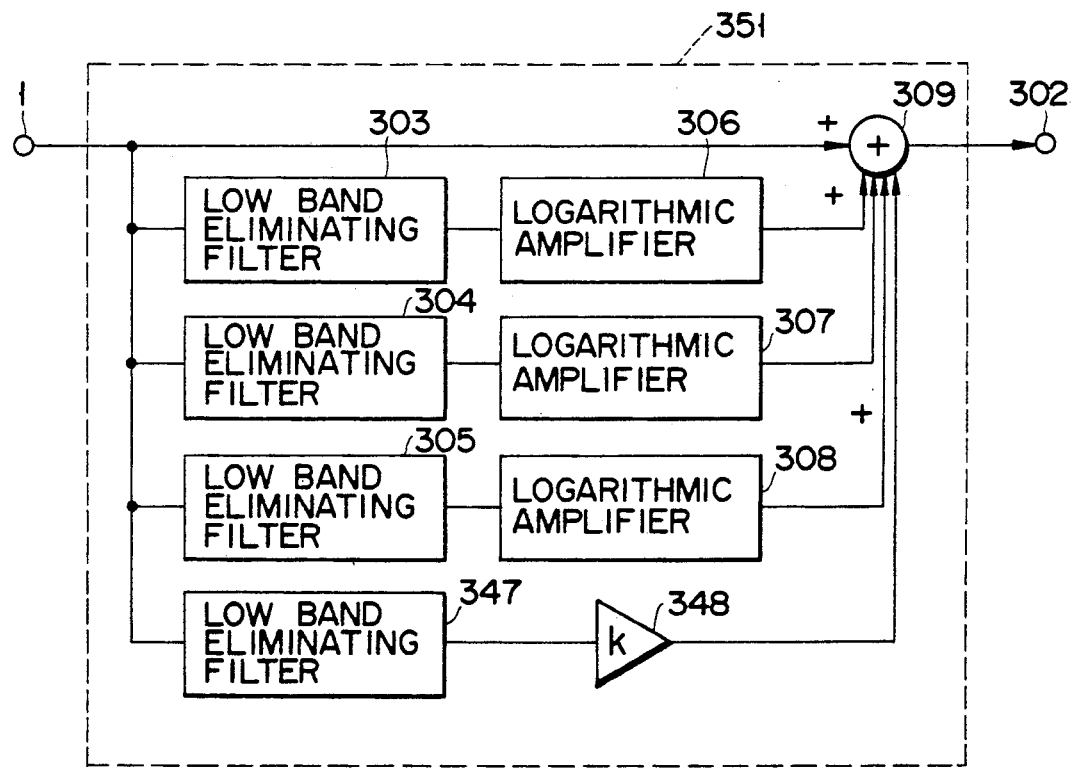
F I G. 36

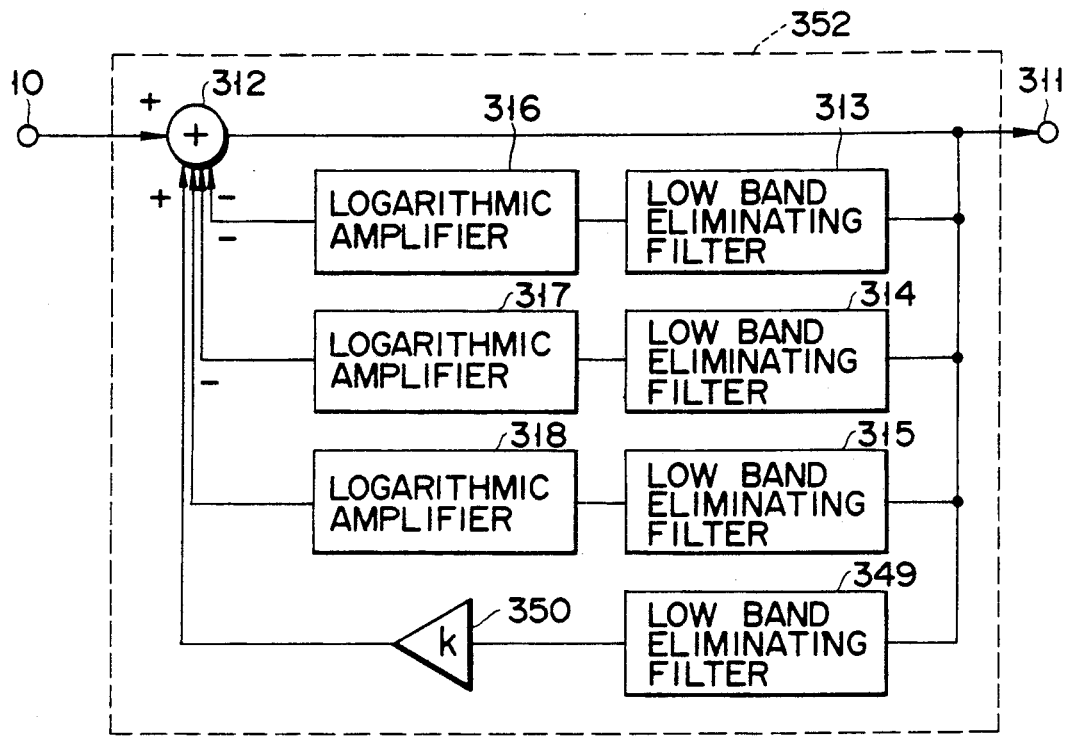
F I G. 37
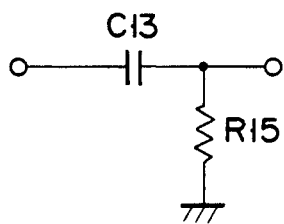
F I G. 38
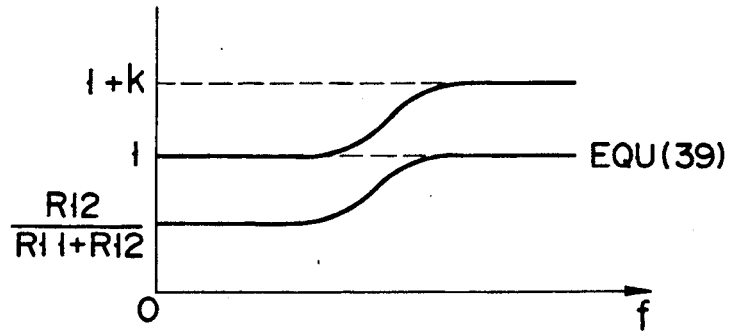
F I G. 39

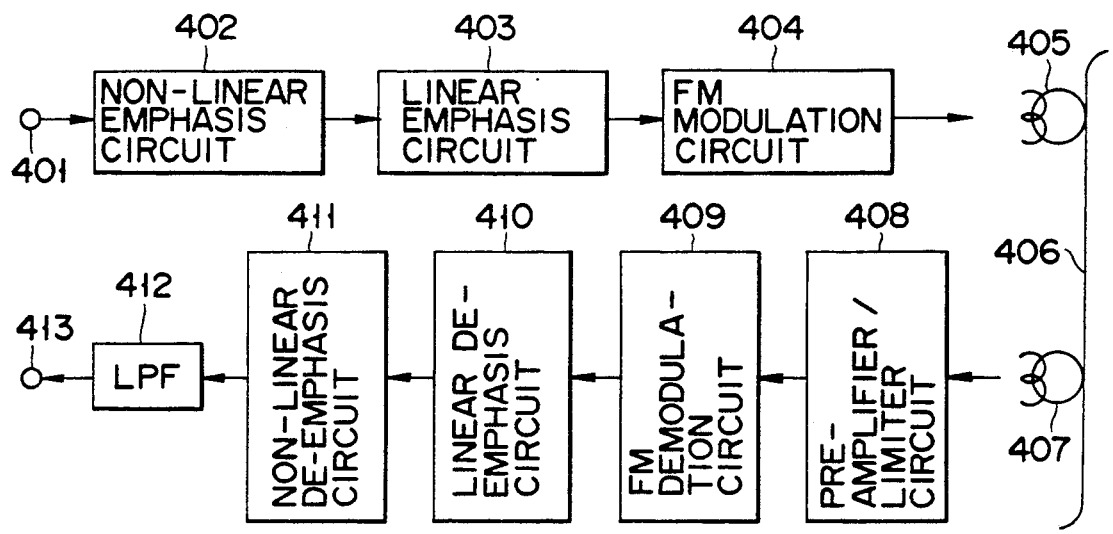
F I G. 40
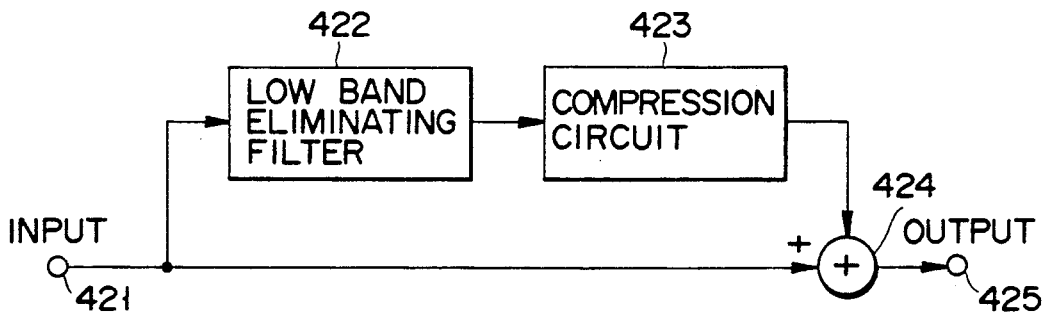
F I G. 41
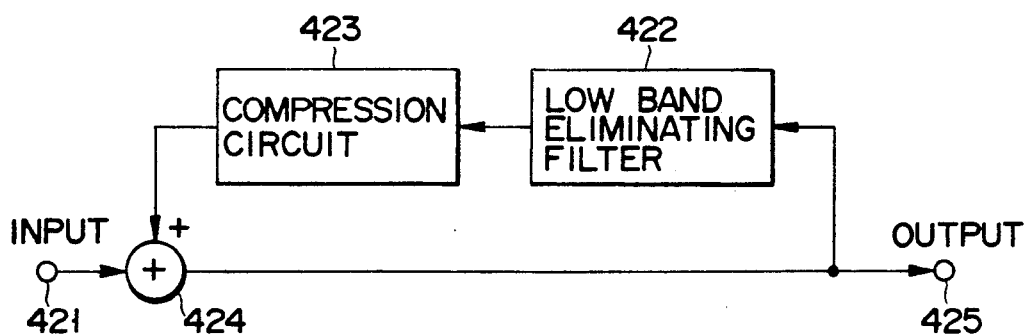
F I G. 42

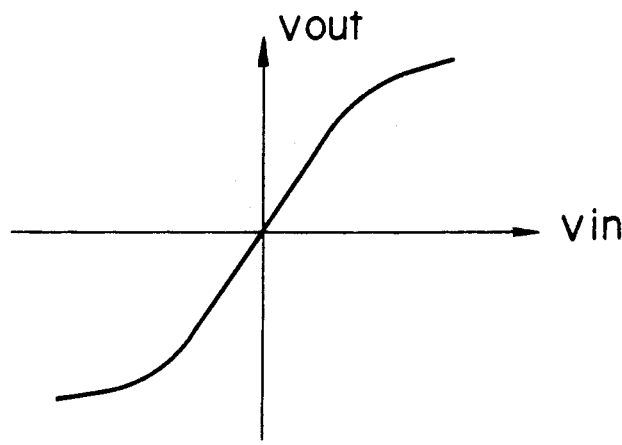
F I G. 43
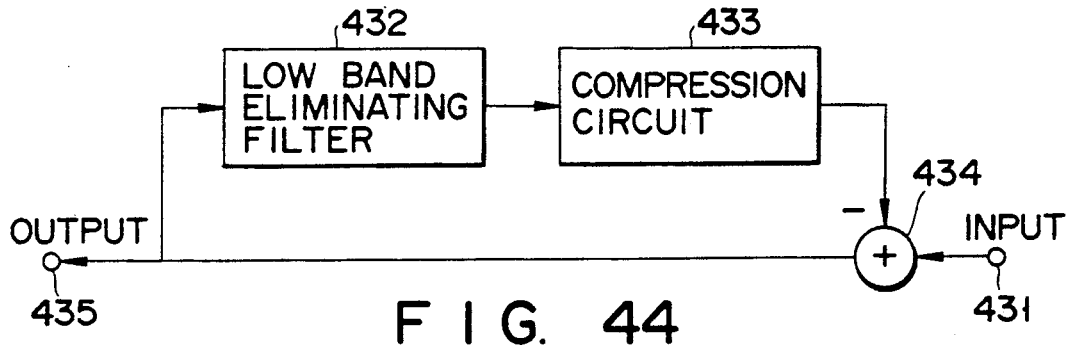
F I G. 44
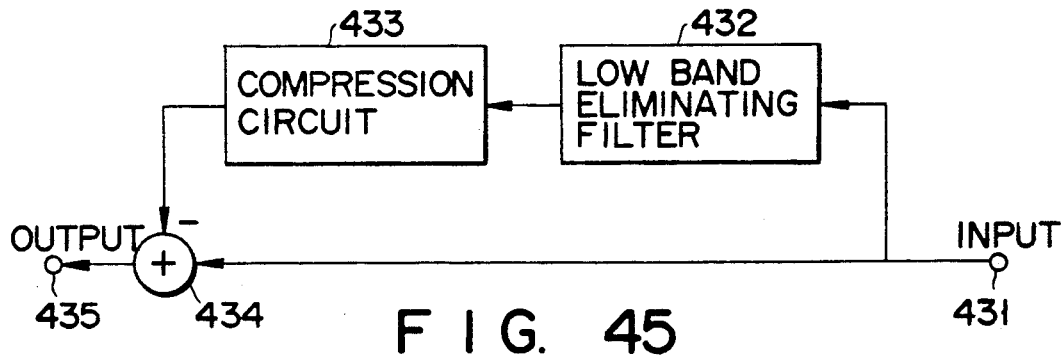
F I G. 45
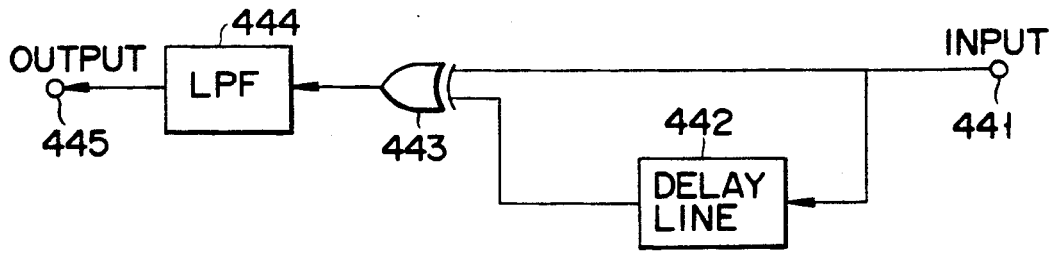
F I G. 46

INPUT
VIDEO
SIGNAL

OUTPUT OF
COMPRESSION
CIRCUIT 423

OUTPUT OF
ADDER 424

CHARACTERISTIC
OF LPF 444

OUTPUT OF
LPF 444

OUTPUT OF
COMPRESSION
CIRCUIT 433

OUTPUT OF
NON-LINEAR
DE-
EMPHASIS
CIRCUIT 411

OUTPUT OF
LPE 412

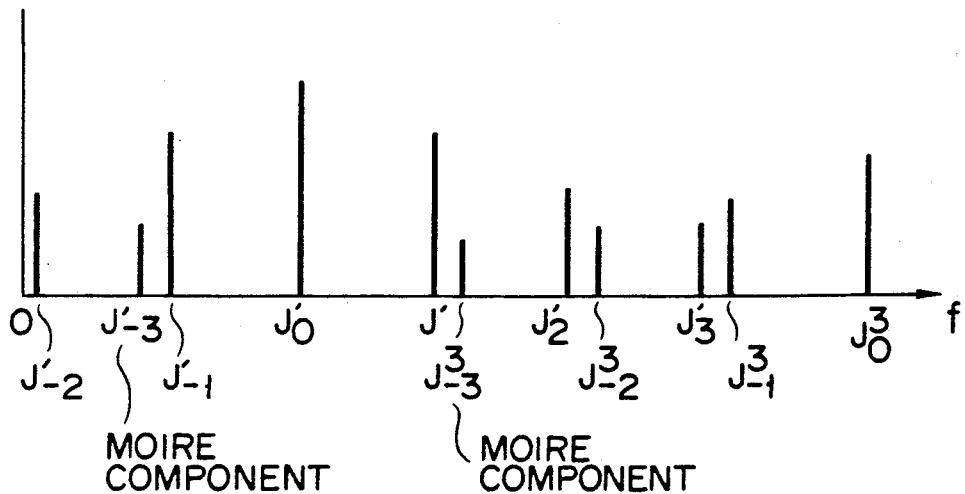
F I G. 56
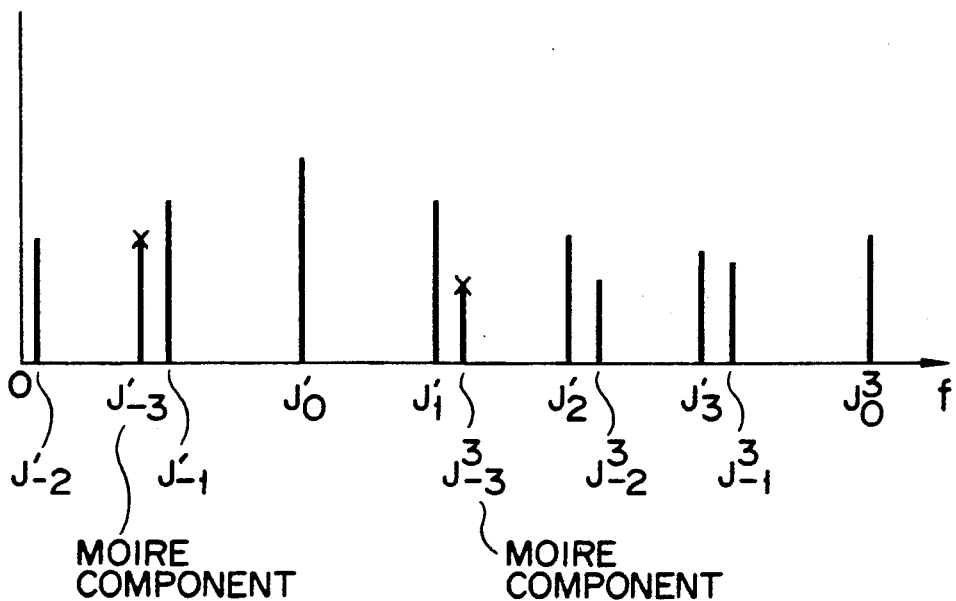
F I G. 57

NON-LINEAR AMPLIFIER AND NON-LINEAR EMPHASIS/DEEMPHASIS CIRCUIT USING THE SAME

BACKGROUND OF THE INVENTION

1. Field of the Invention

The present invention relates to a non-linear amplifier and a non-linear emphasis/deemphasis circuit using the same 2. Description of the Related Art In general, a VTR (video tape recorder) or video disk records a video signal through FM modulation. In recording or reproducing and demodulating an FM modulated signal, the noise distribution after FM demodulation increases as the frequency increases. A so-called triangular noise will occur. As a method for suppressing this triangular noise to improve the S/N ratio, an emphasis/deemphasis technique is used. According to this technique, the high frequency component of a video signal is emphasized by an emphasizer, the resultant signal is subjected to FM modulation, and at the time of demodulation the high frequency component is suppressed by a deemphasizer having the opposite characteristic to the emphasis characteristic.

The emphasis characteristic is restricted by the transfer band of an FM waveform, and if the amount of emphasis is increased too much, a so-called inverting phenomenon would occur in which the white peak of the video signal falls down to the black level. As a method to avoid this inverting phenomenon and further improve the S/N ratio, a non-linear emphasis has been proposed. The non-linear emphasis reduces the amount of emphasis when the amplitude of a video signal is high and increases that amount when the amplitude is low. The non-linear emphasis is disclosed in, for example, "Signal Processing in Four-hour Recording VHS System VTR" in National Technical Report Vol. 25 No. 1 Feb. 1979. The non-linear emphasizer disclosed in this article can avoid the inverting phenomenon. To attain a non-linear emphasis characteristic to a region where an input signal has a minute level (e.g., −26 dB or above), however, the level of the input signal should be set sufficiently large in advance depending on an amplifier so that the non-linear region of a diode can be utilized even in the minute-level region. Consequently, when the intrinsic signal amplitude is high, a signal in the emphasizer would have an excess amplitude. This requires an increase in breakdown voltage of a diode as well as a source voltage.

For a non-linear deemphasizer, it is ideal that the gain A of an amplifier is infinite. The gain A however takes a limited value, and the group delay characteristic and frequency characteristic are deteriorated particularly for a high frequency. It is not therefore possible to attain a non-linear deemphasis characteristic having the totally opposite to the characteristic of a non-linear emphasizer. If the non-linear emphasis characteristic is not completely opposite to the non-linear deemphasis characteristic, a reproduced video signal after FM demodulation may have ringing thereon or have a deteriorated waveform characteristic.

As described above, according to a conventional non-linear emphasis/deemphasis circuit, if the emphasis characteristic should be realized even in a region where an input signal has a minute level, a signal in the circuit would have an excess amplitude. This requires an increase in breakdown voltage of a diode or source voltage. Further, deterioration of the group delay characteristic and frequency characteristic at a high frequency does not permit that an emphasizer and a deemphasizer have completely opposite characteristics, thus impairing the quality of a signal.

SUMMARY OF THE INVENTION

Accordingly, it is an object of this invention to provide a non-linear amplifier which has a non-linear emphasis/deemphasis characteristic even in a region where the level of an input signal is minute, without excessively increasing the signal amplitude in the circuit.

It is another object of the invention to provide a non-linear emphasis/deemphasis circuit which uses such a non-linear amplifier to accurately have mutually opposite characteristics.

According to one aspect of this invention, there is provided a non-linear amplifier circuit comprising:

a low band eliminating filter for receiving an input signal via an input terminal;

a logarithmic amplifier including an amplifier for receiving an output signal of the low band eliminating filter, a bidirectional logarithmic element, and a resistor coupled in parallel thereto between input and output terminals of the amplifier; and an adder for adding an output signal of the logarithmic amplifier and the input signal with a predetermined polarity relationship to provide an output signal and sending the output signal to an output terminal.

According to another aspect of this invention, there is provided a non-linear amplifier circuit comprising:

a low band eliminating filter;

a logarithmic amplifier including an amplifier for receiving an output signal of the low band eliminating filter, a bidirectional logarithmic element and a resistor coupled in parallel thereto between input and output terminals of the amplifier; and an adder for adding an output signal of the logarithmic amplifier and an input signal from an input terminal with a predetermined polarity relationship to provide an output signal and sending the output signal to the low band eliminating filter and an output terminal.

The bidirectional logarithmic element has a logarithmic voltage-current characteristic in positive and negative directions. The resistor coupled together with the bidirectional logarithmic element in parallel to the amplifier serves to determine the gain of the logarithmic amplifier in a region where a signal has a high frequency and a low amplitude. These non-linear amplifier circuits both become a non-linear emphasis circuit if the output signal of the logarithmic amplifier and the input signal are added with the same polarity by the adder, and becomes a non-linear deemphasis circuit if these signals are added with the opposite polarities. In other words, if the frequency of an input signal is low, the output voltage attained via a path of the low band eliminating filter and logarithmic amplifier becomes nearly 0 so that the input signal would appear almost with its own amplitude on the output of the adder, but if the frequency of the input signal is high, the above output voltage becomes an input signal voltage subjected to logarithm conversion so that the smaller the amplitude of the input signal, the greater the output of the adder is emphasized or attenuated.

According to a further aspect of the present invention, there is also provided a non-linear emphasis/deemphasis circuit which uses one of the aforementioned non-linear amplifier circuits (the former being the first non-linear amplifier circuit and the latter the second non-linear amplifier circuit) as a non-linear emphasis circuit and the other as a non-linear deemphasis circuit. In this case, in the first non-linear amplifier circuit, a delay element is inserted into a signal path extending from the input terminal over to the adder through the low band eliminating filter and logarithmic amplifier and the delay time of this delay element is set approximately the same as that of the adder of the second non-linear amplifier circuit.

In assembling the above non-linear emphasis/deemphasis circuit, it is desirable that the first and second non-linear amplifier circuits share a single low band eliminating filter and a single logarithmic amplifier.

Since a logarithmic element is coupled between the input and output terminals of the amplifier according to the present non-linear amplifier circuit, if the gain of the amplifier is at a certain level, a non-linear region of the logarithmic element can be effectively utilized without unnecessarily increasing the level of the input signal, thus ensuring a large amount of emphasis. What is more, the signal amplitude in the circuit will not become excessively high and the breakdown voltage of the logarithmic element and the source voltage can be decreased.

According to the present invention, both the non-linear emphasis circuit and non-linear deemphasis circuit are designed to provide an output signal by adding a signal traveling through a path including the low band eliminating filter and logarithmic amplifier with an input signal. Unlike a system which has a negative feedback loop of an amplifier inserted in a non-linear emphasis circuit to realize a non-linear deemphasis circuit, therefore, the circuit of the present invention does not require that the gain of the amplifier as a factor to attain mutually opposite non-linear emphasis and deemphasis characteristics, thus providing accurately opposite non-linear emphasis and deemphasis characteristics.

BRIEF DESCRIPTION OF THE DRAWINGS

FIG. 6 is a diagram of an equivalent circuit for explaining the operation;

FIG. 7 is a diagram illustrating the characteristic of a well-known logarithmic amplifier;

FIG. 8 is a diagram illustrating the characteristic of a logarithmic amplifier according to the present invention;

FIG. 9 is a circuit diagram illustrating another non-linear amplifier circuit which is more practical than the one shown in FIG. 1;

FIG. 10 is a circuit diagram of a non-linear amplifier circuit according to another embodiment;

FIG. 11 is a circuit diagram of a non-linear amplifier circuit according to a still another embodiment;

FIG. 12 is a diagram of an equivalent circuit of the one shown in FIG. 11;

FIG. 13 is a diagram of an equivalent circuit of the one shown in FIG. 10;

FIG. 14 is a circuit diagram illustrating a non-linear emphasis/deemphasis circuit according to one embodiment of this invention;

FIG. 15 is a block circuit diagram of a non-linear amplifier circuit according to one embodiment of this invention;

FIG. 20 is a diagram illustrating the input/output characteristic of a logarithmic converter in FIG. 19;

FIG. 21 is a block circuit diagram illustrating a non-linear amplifier circuit according to a further embodiment of this invention;

FIGS. 22 through 24 are diagrams illustrating various amplitude limiters used in the non-linear amplifier circuits shown in FIGS. 19 and 21;

FIG. 25 is a block circuit diagram illustrating a non-linear amplifier circuit according to a still further embodiment of this invention;

FIGS. 34 and 35 are circuit diagrams of low band eliminating filters;

FIGS. 36 and 37 are block circuit diagrams illustrating non-linear amplifier circuits according to a still further embodiment;

FIG. 38 is a circuit diagram of a low band eliminating filter;

FIG. 39 is a diagram showing an emphasis characteristic;

FIG. 40 is a block circuit diagram of a video recording/reproducing apparatus;

FIGS. 41 and 42 are block circuit diagrams of non-linear emphasis circuits which are used in the apparatus of FIG. 40;

FIG. 43 is a diagram showing input and output characteristics of a compression circuit provided in an non-linear emphasis circuit;

FIGS. 44 and 45 are block circuit diagrams of a non-linear deemphasis circuit according to the invention;

FIG. 46 is a block circuit diagram of a FM demodulator used in the invention;

FIGS. 56 and 57 are diagrams showing frequency spectrums occurring in operating the apparatus of FIG. 55;

DETAILED DESCRIPTION OF THE PREFERRED EMBODIMENT

Figure 1:
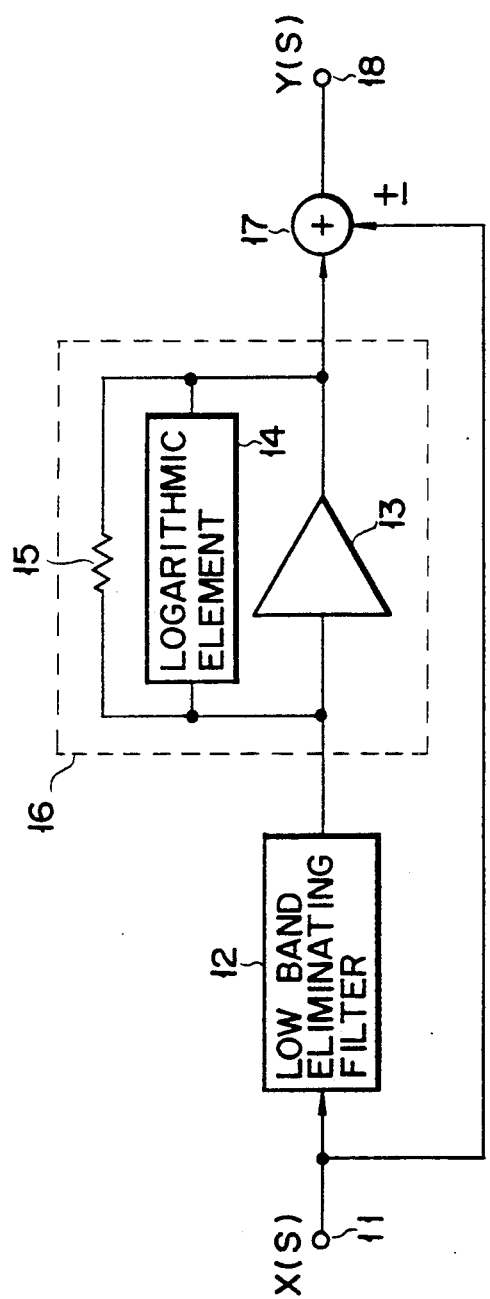
FIG. 1 is a circuit diagram illustrating a non-linear amplifier circuit according to one embodiment of the present invention.

According to the non-linear amplifier circuit shown in FIG. 1, a low band eliminating filter 12 removes low frequency components including a DC component from an input signal X(s) supplied from an input terminal 11. The filter 12 has its output terminal coupled to a logarithmic amplifier 16. A bidirectional logarithmic element 14 and a resistor 15 are coupled in parallel between the input and output terminals of an amplifier 13 of the logarithmic amplifier 16. An output signal of the logarithmic amplifier 16 is input to an adder 17 where it is added to the input signal X(s) with a predetermined polarity relationship. An output signal Y(s) of this adder 17 is supplied to an output terminal 18.

Figure 2C:
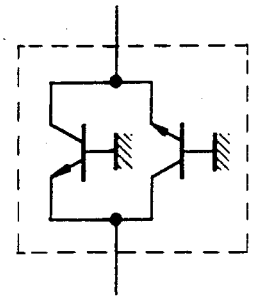
FIGS. 2A to 2C are circuit diagrams illustrating an equivalent circuit if various bidirectional logarithmic elements.
Figure 2B:
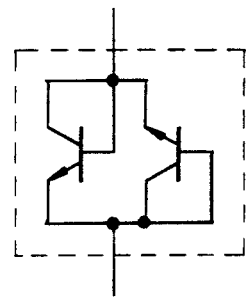
Figure 2A:
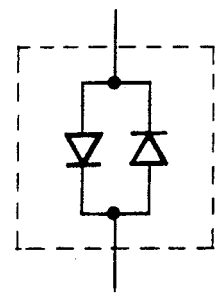

FIGS. 2A through 2C illustrate specific examples of the bidirectional logarithmic element 14. In FIG. 2A, two diodes are coupled in parallel in the opposite bias directions. In FIG. 2B, two transistors having the collector and base coupled together (so-called diode-connected) are coupled in parallel in the opposite bias directions. In FIG. 2C two transistors having the base grounded are coupled in parallel in the opposite bias directions. Alternatively, it is possible to use a logarithmic element which controls the base potential of a transistor to ensure temperature compensation.

If the non-linear amplifier circuit shown in FIG. 1 is used as a non-linear emphasis circuit, the output signal of the logarithmic amplifier 16 and the input signal X(s) need to be added with the same polarity by the adder 17. In this case, given that the total transfer characteristic of the low band eliminating filter 12 and logarithmic amplifier 16 is H(s), and the input signal X(s) and output signal Y(s) are respectively X1(s) and Y1(s), then $$Y1(s) = \{1 + H(s)\} \cdot X1(s) \quad (1)$$

Figure 3:
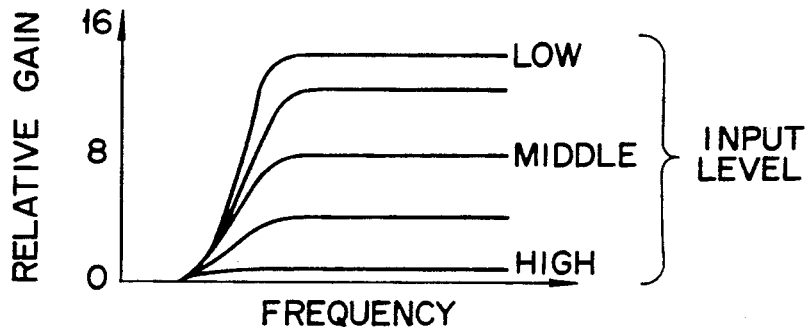
FIG. 3 is a characteristic diagram of a non-linear emphasis circuit based on this invention.

The characteristic is as shown in FIG. 3.

If the non-linear amplifier circuit shown in FIG. 1 is used as a non-linear deemphasis circuit, the output signal of the logarithmic amplifier 6 and the input signal X(s) need to be added with the opposite polarities by the adder 17. In this case, given that the input signal X(s) and output signal Y(s) are respectively X2(s) and Y2(s), then $$Y2(s) = \{1 - H(s)\} \cdot X2(s) \quad (2)$$

Figure 4:
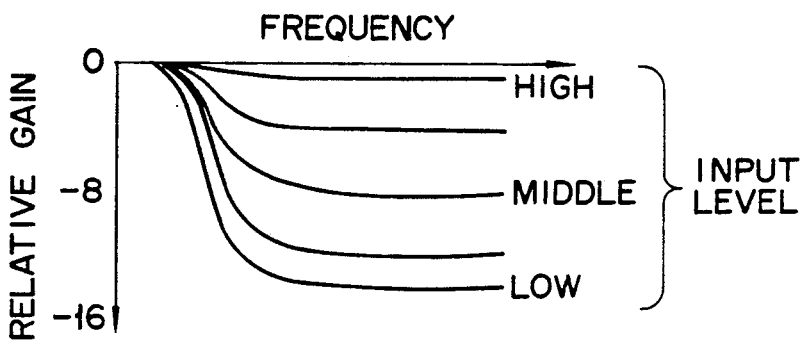
FIG. 4 is a characteristic diagram of a non-linear emphasis circuit based on the this invention.

The characteristic is as shown in FIG. 4.

Figure 5:
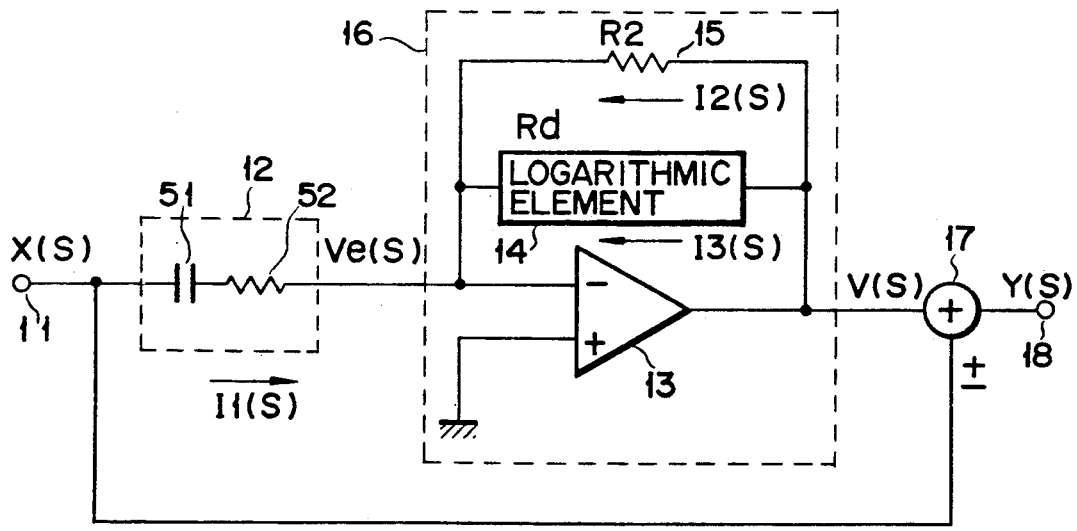
FIG. 5 is a circuit diagram illustrating a non-linear amplifier circuit which is more practical than the one shown in FIG. 1.

According to a non-linear amplifier circuit shown in FIG. 5, the low band eliminating filter 12 is constituted by a series circuit of a capacitor 51 and a resistor 52. The amplifier 13 is an inverting amplifier with the non-inverting input terminal grounded and the logarithmic element 14 and resistor 15 coupled in parallel between the inverting input terminal and the output terminal. In this case, the inverting input terminal of the amplifier 13 is in a virtual grounded state. OEI 2920, for example, is known as a logarithmic amplifier IC having the inverting amplifier 13 and logarithmic element 14 incorporated therein.

FIG. 6 is a diagram for explaining the operation of the non-linear amplifier circuit shown in FIG. 5. With the value of the capacitor 51 being C and the value of the resistor 52 being R1, the impedance Z1(s) of the low band eliminating filter 12 can be expressed by the following equation.

$$Z1(s) = \frac{1}{C \cdot s} + R1 \quad (3)$$

When an input signal X(s) is input to the input terminal 11, a current I1(s) flowing across the capacitor 51 and resistor 52 is:

$$\begin{aligned} I1(s) &= \frac{X(s) - Ve(s)}{Z1(s)} \\ &= \frac{X(x) - Ve(s)}{R1 + (1/C \cdot s)} \end{aligned} \quad (4)$$

where Ve(s) is an error voltage at the inverting input terminal of the amplifier 13.

Given that the output voltage of the amplifier 13 is V(s), a current I2 flowing across the resistor 15 is $$I2(s) = \frac{V(s) - Ve(s)}{R2} \quad (5)$$

Given that the resistance of the bidirectional logarithmic element 14 is Rd, $$I3(s) = \frac{V(s) - Ve(s)}{Rd} \quad (6)$$

Here, given that the parallel combined impedance of the logarithmic element 14 and resistor 15 is Z2(s), $$\frac{V(s) - Ve(s)}{Z2(s)} = \frac{V(s) - Ve(s)}{R1} + \frac{V(s) - Ve(s)}{Rd}$$

That is, $$\frac{1}{Z2(s)} = \frac{1}{R1} + \frac{1}{Rd} \quad (7)$$

As the input current of the amplifier 15 can be neglected, $$I1(s) + I2(s) + I3(s) = 0 \quad (8)$$

$$\frac{X(s) - Ve(s)}{Z1(s)} + \frac{V(s) - Ve(s)}{Z2(s)} = 0$$

With the gain of the amplifier 13 being −K, then $$V(s) = -K \cdot Ve(s) \tag{9}$$

From equations (8) and (9), $$V(s) = \frac{Z2(s) \cdot X(s)}{Z1(s) + \frac{Z1(s) - Z2(s)}{K}} \tag{10}$$

With the gain $-K$ of the amplifier 13 set sufficiently large, $$\begin{aligned} V(s) &= -\frac{Z2(s)}{Z1(s)} \cdot X(s) \\ &= \frac{\frac{R2 \cdot Rd}{R2 + Rd}}{R1 + \frac{1}{C \cdot s}} \cdot X(s) \end{aligned} \tag{11}$$

From equations (5) and (6), the following relation is obtained:

$$R2 \cdot I2(s) = Rd \cdot I3(s) \tag{12}$$

With the use of the aforementioned OEI 2920, for example, the input current I3(s) and output voltage have the characteristics as shown in FIG. 7, and the relationship between I3(s) and Rd is specifically determined. Further, from the equation (12), I2(s) is also determined specifically. Thus, the logarithmic amplifier 16 would have the following output voltage V(s):

(a) When the input signal has a low frequency, s=0, thus $$V(s) \approx 0 \tag{13}$$

(b) When the input signal has a high frequency but a low amplitude, s→∞ and Rd→∞, thus $$V(s) = -\frac{R2}{R1} \cdot X(s) \tag{14}$$

(c) When the input signal has a high frequency and a high amplitude, s→∞ and Rd→∞0, thus $$V(s) = -\frac{Rd}{R1} \cdot X(s) \tag{15}$$

At a higher frequency, therefore, a non-linear emphasis characteristic is obtained in which the gain is high when the input signal has a low amplitude, and the gain is low when the input signal has a high amplitude, as shown in FIG. 8. It should be clear from this diagram that the non-linear emphasis characteristic is realized even in a region where the amplitude of the input signal is significantly as low as −40 dB.

The logarithmic element 14 is coupled between the input and output terminals of the amplifier 13, so that the potential difference between these terminals is large even if the amplitude of the input signal is low. Accordingly, a diode or transistor can easily be rendered ON. The non-linear region of the logarithmic element 14 can be used, unlike in the conventional case, without unnecessarily increasing the amplitude of the input signal. This ensures a low voltage in the non-linear amplifier circuit, so that the diode and transistor constituting the logarithmic element 14 do not require a high breakdown voltage, nor does the amplifier 13 require a high source voltage.

FIG. 9 is a specific circuit diagram of the non-linear amplifier circuit shown in FIG. 1. The low band eliminating filter 12 comprises a capacitor 61 and a resistor 62 coupled in series between the input terminal 11 and the ground, the junction between these two being coupled to the non-inverting input terminal of the amplifier 13. A resistor 63 is coupled between the inverting input terminal of the amplifier 13 and the ground. This resistor 63 together with the resistor 15 determines the gain of the logarithmic amplifier 6. In the non-linear amplifier circuit shown in FIG. 5, the output signal of the low band eliminating filter 12 is given as a current signal to the amplifier 13 where it is subjected to current-voltage conversion. The non-linear amplifier circuit shown in FIG. 9 fundamentally differs from the circuit of FIG. 5 in that the output signal of the filter 12 is given as a voltage signal to the amplifier 13, but these circuits have the same operations and effects.

FIG. 10 illustrates a non-linear amplifier circuit according to another embodiment of the present invention. Referring to this diagram, a low band eliminating filter 22, a logarithmic amplifier 26 constituted by an amplifier 23, a bidirectional logarithmic element 24 and a resistor 25, and an adder 27 are the same as the low band eliminating filter 12, logarithmic amplifier 16 and adder 17 shown in FIG. 1. In this embodiment, an input signal E(s) supplied from an input terminal 21 is given to one of the input terminals of the adder 27, and is added with the output signal of the logarithmic amplifier 26 with a predetermined polarity relationship. The output signal, F(s), of the adder 27 is supplied to an output terminal 28 and the low band eliminating filter 22. The output signal of the filter is input to the logarithmic amplifier 26.

If the non-linear amplifier circuit shown in FIG. 10 is used as a non-linear deemphasis circuit, the output signal of the logarithmic amplifier 26 and the input signal E(s) need to be added with the opposite polarities by the adder 27. In this case, given that, as in the case of FIG. 1, the total transfer characteristic of the low band eliminating filter 22 and logarithmic amplifier 26 is H(s) and the input signal E(s) and output signal F(s) are respectively E1(s) and F1(s), then $$F1(s) = E1(s) - H(s) \cdot F1(s) \tag{16}$$

Thus, $$F1(s) = \frac{1}{1 + H(s)} \cdot E1(s) \tag{17}$$

The characteristic approximately becomes the one shown in FIG. 4.

Assume that the non-linear amplifier circuit shown in FIG. 1 is used as a non-linear emphasis circuit and the non-linear amplifier circuit in FIG. 10 as a non-linear deemphasis circuit. In this case, provided that the output signal Y1(s) of the non-linear emphasis circuit having the arrangement of FIG. 1 equals the input signal E1(s) of the non-linear deemphasis circuit having the arrangement of FIG. 10 (i.e., E1(s)=Y1(s)), substituting the equation (1) into the equation (17) yields $$\begin{aligned} F1(s) &= \frac{1}{1 + H(s)} \cdot \{1 + H(s)\} \cdot X1(s) \\ &= X1(s) \end{aligned} \tag{18}$$

Thus, the input signal X1(s) of the non-linear emphasis circuit coincides with the output signal F1(s) of the non-linear deemphasis circuit. In other words, the non-linear emphasis characteristic and the non-linear deemphasis characteristic ca be set completely opposite to each other.

If the non-linear amplifier circuit shown in FIG. 10 is used as a non-linear emphasis circuit, the output signal of the logarithmic amplifier 26 and the input signal E(s) need to be added with the same polarity by the adder 27. In this case, given that the input signal E(s) and output signal F(s) are respectively E2(s) and F2(s), then $$F2(s) = E2(s) - H(s) \cdot F2(s) \quad (19)$$

Thus, $$F2(s) = \frac{1}{1 - H(s)} \cdot E2(s) \quad (20)$$

The characteristic nearly becomes the one shown in FIG. 3.

Assume that the non-linear amplifier circuit shown in FIG. 10 is used as a non-linear emphasis circuit and the non-linear amplifier circuit in FIG. 1 as a non-linear deemphasis circuit. In this case, provided that the output signal F2(s) of the non-linear emphasis circuit having the arrangement of FIG. 10 equals the input signal X2(s) of the non-linear deemphasis circuit having the arrangement of FIG. 1 (i.e., F2(s)=X2(s)), substituting the equation (20) into the equation (2) yields $$Y2(s) = \{1 - H(s)\} \cdot \frac{1}{1 - H(s)} \cdot E2(s) \quad (21)$$
$$= E2(s)$$

Thus, the input signal E2(s) of the non-linear emphasis circuit coincides with the output signal Y2(s) of the non-linear deemphasis circuit. In other words, the non-linear emphasis characteristic and the non-linear deemphasis characteristic can be set completely opposite to each other.

In the foregoing description, a delay time in the circuit is ignored. Actually, however, some delay is present, the transfer function differs slightly from the above one. FIG. 11 illustrates a circuit in which a delay element 19 for delay compensation is inserted between the logarithmic amplifier 16 and adder 17 in the non-linear amplifier circuit shown in FIG. 1. The location of the delay element 19 is not restricted to this particular place, but it may be provided anywhere on the signal path extending from the input terminal 11 to the adder 17 through the low band eliminating filter 12 and logarithmic amplifier 16.

Assume that the non-linear amplifier circuit shown in FIG. 11 is used as a non-linear emphasis circuit and the non-linear amplifier circuit in FIG. 10 as a non-linear deemphasis circuit. Provided that, as shown in FIG. 12, the transfer function and the delay time of the low band eliminating filter 12 and logarithmic amplifier 16 in FIG. 11 are H(s) and τ1, the delay time of the adder 17 is τ2, and the delay time of the delay element 19 is τ3, then the following equation is satisfied.

$$\{X(s) + H(s) \cdot e^{-\tau 1 s} \cdot e^{-\tau 3 s} \cdot X(s)\} e^{-\tau 2 s} = Y(s)$$

$$\{1 + H(s) \cdot e^{-(\tau 1 + \tau 3)s}\} e^{-\tau 2 s} \cdot X(s) = Y(s) \quad (22)$$

Provided that, as shown in FIG. 13, the transfer function and the delay time of the low band eliminating filter 22 and logarithmic amplifier 26 in FIG. 10 are H(s) and τ1, and the delay time of the adder 27 is τ2, then the following equation is satisfied.

$$\{Y(s) - H(s) \cdot e^{-\tau 1 s} \cdot Z(s)\} e^{-\tau 2 s} = Z(s) \quad (23)$$
$$Y(s) = \{H(s) \cdot e^{-\tau 1 s} + e^{\tau 2 s}\} Z(s)$$

$$Z(s) = \frac{1}{H(s) \cdot e^{-\tau 1 s} + e^{\tau 2 s}} \cdot Y(s)$$

Substituting the equation (22) into the equation (23) yields $$Z(s) = \frac{\{1 + H(s) \cdot e^{-(\tau 1 + \tau 3)s}\} e^{-\tau 2 s}}{H(s) \cdot e^{-\tau 1 s} + e^{\tau 2 s}} \cdot Y(s) \quad (24)$$
$$= \frac{1 + e^{-(\tau 1 + \tau 3)s} \cdot H(s)}{1 + e^{-(\tau 1 + \tau 2)s} \cdot H(s)} \cdot X(s) \cdot e^{-2\tau 2 s}$$

It should be obvious from the equation (24) that the total delay time of the non-linear emphasis circuit having the arrangement of FIG. 11 and the non-linear deemphasis circuit having the arrangement of FIG. 10 is 2τ2, which is the sum of the delay times of the adders 17 and 27. Paying attention to the first term on the right-hand side of the equation (24), it should be understood that given τ3=τ2, i.e., if the delay time of the adder 27 is set equal to that of the delay element 19, the output signal Z(s) of the non-linear deemphasis circuit is simply the input signal X(s) of the non-linear emphasis circuit delayed. This indicates that the non-linear emphasis circuit and the non-linear deemphasis circuit have the completely opposite characteristics.

With the non-linear amplifier circuit of FIG. 11 (which is the circuit of FIG. 1 with the delay element 19 added thereto) used as a non-linear emphasis circuit and the non-linear amplifier circuit of FIG. 10 used as a non-linear deemphasis circuit, even in consideration of a delay in the circuit, the emphasis characteristic and the deemphasis characteristic can be set completely opposite to each other.

If the circuit of FIG. 10 is used as a non-linear emphasis circuit and the circuit of FIG. 11 as a non-linear deemphasis circuit, the same effects can of course be attained.

It is preferable that the total delay time τ1 of the low band eliminating filter 12 and logarithmic amplifier 16 in FIG. 12 be shorter than the half cycle of the maximum frequency component of the input signal. It is assumed that the delay time τ3 of the delay element 19 in FIG. 12 is 0.

Assume that a signal component of an input signal (e.g., a video signal) with the maximum frequency fm is input to the input terminal 11. Given that the total gain of the low band eliminating filter 12 and logarithmic amplifier 16 is 1 and the adding ratio of the adder 17 is 1:1, the output signal y(t) expressed as a function of time is given as:

$$y(t) = \sin(2\pi fm \, t) + \sin\{2\pi fm(t + \tau 1)\} \quad (25)$$

The period Tm of the maximum frequency component of the input signal is given as:

$$Tm = 1/fm \quad (26)$$

Assuming that one half of the period Tm equals $\tau 1$, then $$\tau 1 = Tm/2 \quad (27)$$
$$= 1/2fm$$

Substituting the equation (27) into the equation (25) yields $$\begin{aligned} y(t) &= \sin(2\pi fm\ t) + \sin(2\pi fm\ t + \pi) \\ &= \sin(2\pi fm\ t) - \sin(2\pi fm\ t) \\ &= 0 \end{aligned}$$

Thus, the input signal cannot be transferred.

If $\tau 1 > \frac{1}{2}$fm, y(t) will not be 0, so that the input signal can be accurately transferred.

With the structure of FIG. 10, to accurately transfer an input signal, the total delay time of the low band eliminating filter 22, logarithmic amplifier 26 and adder 27 need to be set shorter than half the period of the maximum frequency component of the input signal.

As the non-linear amplifier circuits shown in FIGS. 10 and 11 both use, as the constituents, a low band eliminating filter, a logarithmic amplifier and an adder, part or all of these elements can be shared.

FIG. 14 illustrates a non-linear emphasis/deemphasis circuit in which the low band eliminating filters 12 and 22 and the logarithmic amplifiers 16 and 6, both shown in FIGS. 10 and 11, are constituted by a single low band eliminating filter and a single logarithmic amplifier, respectively. Numerals 11 and 18 denote the input and output terminals of the emphasis circuit and numerals 21 and 28 denote the input and output terminals of the deemphasis circuit. When select switches 31 and 32 are connected as indicated by the solid lines, the low band eliminating filter and the logarithmic amplifier are used in the emphasis circuit. When the select switches 31 and 32 are connected as indicated by the broken lines, the low band eliminating filter and the logarithmic amplifier are used in the deemphasis circuit.

Sharing the low band eliminating filter and logarithmic amplifier in the emphasis circuit and deemphasis circuit simplifies the overall structure of the non-linear emphasis/deemphasis circuit and contributes to reduction in cost. In addition, it is unnecessary to consider the otherwise possible difference in characteristic between the emphasis circuit and deemphasis circuit in a case where the low band eliminating filter and logarithmic amplifier are provided in each circuit, so that the emphasis characteristic and deemphasis characteristic can be set opposite to each other more perfectly.

In FIG. 14, the circuit of FIG. 11 is used as a non-linear emphasis circuit and the circuit of FIG. 10 as a non-linear deemphasis circuit. If the former circuit is used as a non-linear deemphasis circuit and the latter one as a non-linear emphasis circuit, these two circuits can still share the low band eliminating filter and logarithmic amplifier.

The non-linear amplifier circuit according to the above embodiment is designed in such a way that an input signal and an input signal passing through the low band eliminating filter and logarithmic amplifier or an output signal are added with a predetermined polarity relationship and the added signal is treated as an output signal. Accordingly, a non-linear type amplifying function can be attained from a region where the input signal has a very low amplitude without unnecessarily setting the level of the input signal high. If the amount of emphasis (deemphasis) is set greater in order to enhance the S/N improved effect, therefore, the signal amplitude within the circuit will not become excessively large, thus making it possible to reduce the breakdown voltage of the logarithmic element and the source voltage.

According to this embodiment, one of the first non-linear amplifier circuit having a feed-forward structure to lead an input signal onto a path of a low band eliminating filter and a logarithmic amplifier and having a delay element inserted in the path extending from an input terminal to an adder through the filter and the logarithmic amplifier, and the second non-linear amplifier circuit having a feedback structure to lead an output signal onto a path of a low band eliminating filter and the delay time of an adder being set substantially the same as that of the delay element of the first non-linear amplifier circuit, is used as a non-linear emphasis circuit and the other one is used as a non-linear deemphasis circuit. With this arrangement, the characteristic of the non-linear emphasis circuit and that of the non-linear deemphasis circuit can be made accurately opposite to each other. This can prevent the signal quality from being deteriorated due to unbalanced non-linear emphasis and deemphasis characteristics. In case of a VTR, particularly, deterioration of image quality can be minimized even when dubbing is carried out several times.

Further, as the non-linear emphasis circuit and non-linear deemphasis circuit can share a low band eliminating filter and a logarithmic amplifier, the circuit structure can be simplified, thus contributing to reduction in cost. This arrangement can also prevent the symmetry of the emphasis characteristic and the deemphasis characteristic from being impaired by the otherwise possible unbalanced characteristics of the low band eliminating filters and logarithmic amplifiers, thus providing better non-linear emphasis and deemphasis characteristics.

Another embodiment will now be described referring to FIG. 15.

This embodiment has the following basic structure. A logarithm converter comprises a plurality of amplitude limiting amplifiers cascade-connected on the output side of, for example, a filter circuit, and each amplitude limiting amplifier comprises an amplifier for amplifying an input signal, an amplitude limiter for amplifying the input signal and limiting an output signal to a given amplitude, and an adder for adding the output signal of this amplitude limiter and the output signal of the amplifier.

According to this embodiment, an add circuit is provided to attain the sum of the output signals of a plurality of amplitude limiters and the output signal of the filter circuit.

According to this embodiment, a signal path including a filter circuit for removing low frequency components of an input video signal or an output video signal and a logarithm converter, has a characteristic such that the gain is low in a region where the frequency of the input video signal is low and the gain becomes higher as the signal amplitude becomes lower in a region where the frequency of the input video signal is high. If the output signal of the logarithm converter is added with an input video image by a synthesizing circuit, therefore, a non-linear emphasis characteristic can be attained in which the amount of emphasis (of a high frequency component) is small when the input video signal has a high amplitude, and increases as the amplitude of the input video signal becomes lower. If subtraction is executed by the synthesizing circuit, a non-linear deemphasis characteristic opposite to the non-linear emphasis characteristic can be attained.

In this case, since the logarithm converter utilizes a non-linear input/output characteristic of the amplitude limiting amplifier, the non-linear emphasis characteristic or non-linear deemphasis characteristic can be easily attained in a minute-level region.

Further, since this logarithm converter has a low gain with respect to a high-amplitude signal, the amplitude of the input signal will not become excessively large. This suppresses occurrence of wave distortion and contributes to reduction in necessary voltage.

According to the non-linear amplifier circuit in FIG. 15, a video signal input from a terminal 101 is supplied to one input terminal of a low band eliminating filter and an input terminal of an adder 105 serving as a synthesizing circuit. The low band eliminating filter 102 removes low frequency components including a DC component in order to provide an emphasis characteristic or a deemphasis characteristic to a high frequency component as well as to prevent the input/output characteristic of a logarithm converter 103 with respect to an input signal having an AC component from being influenced by the DC component of the input signal. The output signal of the filter 102 is input to the logarithm converter 103. The output signal of this converter 103 is supplied to the other input terminal of the adder 105. The output signal of the adder 105 is supplied as an output video signal to an output terminal 106.

The logarithm converter 103 comprises a plurality (N) of cascade-connected amplitude limiting amplifiers 141-14N. Each amplitude limiting amplifier comprises an amplifier 111 for amplifying an input signal, an amplitude limiter 112 for amplifying the input signal and limiting an output signal to a given amplitude (VL), and an adder 113 for adding the output signals of the amplifier 111 and amplitude limiter 112.

Figures 16, 17:
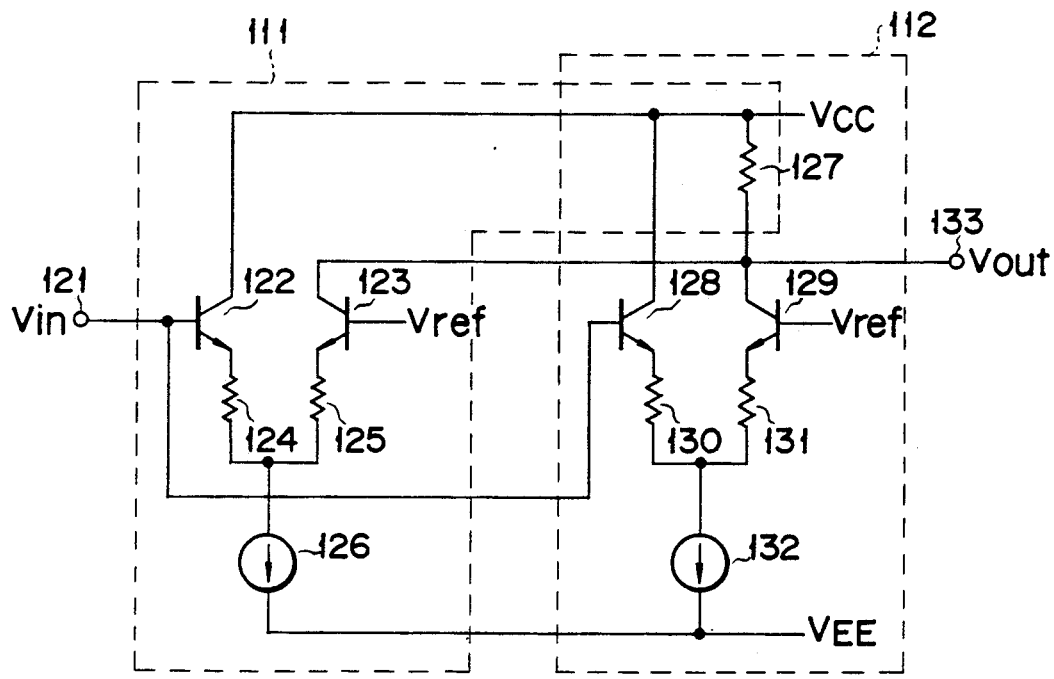
FIG. 16 is a circuit diagram illustrating an amplitude limiter in FIG. 15.
FIG. 17 is a diagram illustrating the input/output characteristic of a logarithmic converter in FIG. 15.

FIG. 16 illustrates in detail one of the amplitude limiting amplifiers 141-14N. Referring to FIG. 16 the amplifier 111 includes transistors 122 and 123, emitter resistors 124 and 125, a constant current source 126 and a collector resistor 127. The amplitude limiter 112 includes transistors 128 and 129, emitter resistors 130 and 131, a constant current source 132 and the collector resistor 127. The transistors 122 and 128 have their bases coupled to terminal 121 to which an input signal Vin is supplied. The transistors 123 and 129 have their bases supplied with a reference voltage Vref. The transistors 122 and 123 have their emitters coupled commonly to the constant current source 126 through the resistors 124 and 125, respectively. Similarly, the transistors 128 and 129 have their emitters coupled commonly to the constant current source 132 through the resistors 130 and 131, respectively. The transistors 122 and 128 have their collectors coupled to a power source Vcc, and the transistors 123 and 129 have their collectors coupled to an output terminal 133 as well as to the power source Vcc commonly through the resistor 127.

The values of the emitter resistors 130 and 131 of the amplitude limiter 112 are set smaller than those of the emitter resistors 124 and 125 of the amplifier 111. In this case, given that the amplifier 111 and amplitude limiter 112 have the same factors except the emitter resistors, the gain k of the amplifier 111 and the gain l of the amplitude limiter 112 is normally k<l.

Since the sum of the collector currents of both transistors 123 and 129 flows through the resistor 127 commonly coupled to the collectors of these transistors, a voltage signal corresponding to the output of the adder 113 in FIG. 15 appears on the collectors of the transistor 123 and 129 (or output terminal 133). In other words, the adder 113 is substantially constituted by the resistor 127.

The output signal Vout of each of the amplitude limiting amplifiers 141-14N is expressed by the following equation (28) when the input signal Vin is Vin≦VL/l.

$$Vout = Vin \cdot (k+l) \tag{28}$$

The output signal Vout is expressed by the following equation (29) when Vin>VL/l.

$$Vout = k \cdot Vin + VL \tag{29}$$

When the input signal Vil of the first amplitude limiting amplifier 141 (input signal of logarithm converter 103) is Vil≦VL/(k+l)·I, the output signal VoI of the I-th amplitude limiting amplifier 14I has a linear relation with the input signal Vil of the first amplitude limiting amplifier 141.

When amplitude limiting is done by the I-th amplitude limiting amplifier 14I (i.e., when the input signal ViI of the amplitude limiting amplifier 14I is greater than VL/l), the output signal VoN of the N-th amplitude limiting amplifier 14N (output signal of the logarithm converter 143) is given by:

$$VoN = VL(1 + k + k^2 + \ldots k^{N-I-1}) + \tag{30}$$

$$Vil(k + l)l \cdot k^{N-I}$$

If k=1, for example, the equations (30) can be rewritten as:

$$VoN = VL\,(N-I) + Vil\,(l+1)\,I \tag{31}$$

FIG. 17 illustrates, in the form of a table, the relationship between the input signal Vil and output signal VoI given in the equation (31), or the input/output characteristic of the logarithm converter 103.

As should be apparent from the above table, the input/output characteristic of the logarithm converter 103 shows approximately a logarithmic characteristic.

Therefore, the signal path including the low band eliminating filter 102 and the logarithm converter 103, shown in FIG. 15, has a characteristic that shows a low gain in a low-frequency region where signal passing is limited by the filter 102, shows a high gain in a high-frequency region when the signal amplitude is low, and shows a low gain in the high-frequency region when the signal amplitude is high. If the input video signal and the output signal of the logarithm converter 103 are synthesized with the same polarity (added) by the adder 105, therefore, the amount of emphasis is small when the input video signal has a high amplitude, and increase as the amplitude of the input video signal becomes lower. Subsequently, the non-linear amplifier circuit of FIG. 15 becomes a non-linear emphasis circuit. On the other hand, if the input video signal and the output signal of the logarithm converter 103 are synthesized with the opposite polarities (subtracted from each other) by the adder 105, therefore, the non-linear amplifier circuit of FIG. 15 becomes a non-linear deemphasis circuit.

According to this embodiment, the amplitude limiting amplifiers 141-14N, which each function as a simple amplifier when the input video signal has a low amplitude and as a amplitude limiter when the video signal has a high amplitude, and each have a non-linear characteristic, are cascade-connected to realize the logarithm converter 103. Accordingly, a non-linear emphasis characteristic or non-linear deemphasis characteristic can easily be attained even in a minute-signal level region. Further, since the logarithm converter 103 has a low gain with respect to a signal with a high amplitude and the internal signal amplitude will not become excessively large, this converter 103 can suppress occurrence of wave distortion and reduce the necessary level of the power source (Vcc, etc.).

Figures 18, 19:
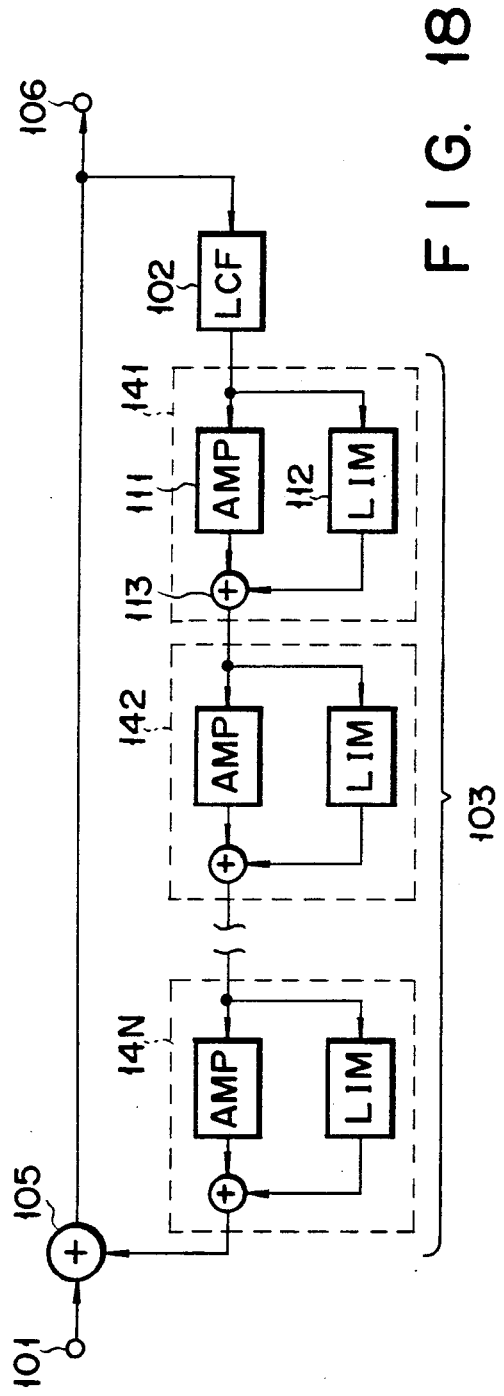
FIG. 18 is a block circuit diagram illustrating a non-linear amplifier circuit according to another embodiment of this invention.
FIG. 19 is a block circuit diagram illustrating a non-linear amplifier circuit according to a still another embodiment of this invention.

FIG. 18 illustrates a non-linear amplifier circuit according to a further embodiment. The non-linear amplifier circuit in FIG. 15 has a feed-forward structure in which an input video signal and a signal attained by permitting the video signal to pass through the low band eliminating filter 102 and logarithm converter 103 are added together by the adder 105, whereas this embodiment has a feedback structure. That is, according to this embodiment, part of an output video signal to be sent to the output terminal 106 is fed back to the other input terminal of the adder 105 through the low band eliminating filter 102 and logarithm converter 103 and is added with the input video signal from the input terminal 101, and the output signal of the adder 105 is supplied to the output terminal 106 as an output video signal. The logarithm converter 103, like the one shown in FIG. 15, is constituted by the amplifier 111, amplitude limiter 112 and adder 113.

In this case, if the input video signal and the output signal of the logarithm converter 103 are synthesized with the same polarity by the adder 104, which is a synthesizer as per the embodiment of FIG. 15, the non-linear amplifier circuit of FIG. 15 becomes a non-linear emphasis circuit. If these two signals are added with the opposite polarities, a non-linear deemphasis circuit is realized.

FIG. 19 is a block diagram illustrating a non-linear amplifier circuit according to a still further embodiment. An input video signal from the input terminal 101 is supplied to one input terminal of the low band eliminating filter 102 and an one input terminal of an adder 105 serving as a synthesizing circuit. The output signal of the filter 102 is input to the logarithm converter 107 whose output signal is supplied to the other input terminal of the adder 105. The output signal of the adder 105 is supplied as an output video signal to the output terminal 106.

The logarithm converter 107 of this embodiment, unlike the logarithm converter 103 in FIG. 15 or 18, comprises N amplitude limiters 181-18N cascade-connected to the output side of the low band eliminating filter 102, and an adder 109 which attains the total sum of the output signal of the filter 102 and the output signals of the amplitude limiters 181-18N. The output signal of the adder 109 is an output of the logarithm converter 107. With the input signal of this logarithm converter 107 input signal of the first amplitude limiter 181) being Vi and the output signal (output signal of the adder 109) being Vo, the relationship between these signals or the input/output characteristic of the logarithm converter 107 becomes approximately logarithmic as shown in FIG. 20.

FIG. 21 illustrates a non-linear amplifier circuit according to a still further embodiment which employs a feedback structure as compared with the feed-forward structure shown in FIG. 19. That is, part of the output video signal from the output terminal 106 is input to the low band eliminating filter 102, and the output signal of this filter 102 is fed back to the other input terminal of the adder 105 through the logarithm converter 107 which is similar to the one used in the embodiment of FIG. 19.

According to both embodiments of FIGS. 19 and 21, if two input signals are synthesized with the same polarity by the adder 105, a non-linear emphasis characteristic is attained, and if these signals are synthesized with the opposite polarities, a non-linear deemphasis characteristic is attained.

FIG. 22 illustrates one specific example of the amplitude limiters 181-181N used in the embodiment of FIG. 21. This amplitude limiter is a differential amplifier which comprises emitter-connected transistors 152 and 153, a constant current 154 coupled to the emitter junction of the transistors, and resistors 155 and 156 respectively coupled to the collectors thereof. The transistor 152 has its base coupled to an input terminal 151, and the transistor 153 has its base supplied with a reference voltage Vref. The transistor 153 has its collector coupled to an output terminal 158. To improve the linearity, a capacitor 157 may be coupled between the collectors of the transistors 152 and 153.

FIGS. 23 and 24 illustrate amplitude limiters designed to improve the linearity of an output signal with respect to such a low-amplitude input signal that is not normally subjected to amplitude limiting.

The amplitude limiter shown in FIG. 23 comprises a first differential amplifier including transistors 162 and 163 and a constant current source 164 coupled to the emitter junction thereof, and a second differential amplifier including transistors 165 and 166 and a constant current source 167 coupled to the emitter junction thereof. The transistors 162 and 165 have their collectors commonly coupled to a load resistor 168, and the transistors 163 and 166 have their collectors commonly coupled to a load resistor 169. The transistors 162 and 165 have their bases coupled to an input terminal 161, and the transistors 163 and 166 have their bases supplied with a reference voltage Vref. The collectors of the transistors 163 and 166 are coupled to an output terminal 170. The emitter area ratio of the transistors 162 and 165 is selected to be 1:n (n being an arbitrary number greater than 1; for example $n \approx 4$), and the emitter area ratio of the transistors 163 and 166 is selected to be n:1.

With the structure shown in FIG. 23, by giving an offset to the output current (collector current) of the transistor, the linearity of the output terminal particularly in a case where a low-amplitude signal is input, can be improved.

In the circuit shown in FIG. 24, an input signal Vin coming from a terminal 171 is applied to the base of a transistor 172. The transistor 172 has its emitter coupled through a resistor 173 to a constant current source 174, and the input signal Vin added with a DC offset is attained across the resistor 173. The signal appearing across the resistor 173 is input to the bases of transistors 176 and 177 which have their collectors commonly coupled to a resistor 175.

A reference voltage Vref from a terminal 178 is supplied to the base of a transistor 179 which, like the transistor 172, is coupled through a resistor 190 to a constant current source 191. The reference voltage Vref added with a DC offset is obtained across the resistor 190. This signal appearing across the resistor 190 is input to the bases of transistors 193 and 194 having the collectors commonly coupled to a resistor 192.

The emitters of the transistors 176 and 194 are connected together, so are the emitters of the transistors 177 and 193. The former emitter junction is coupled to a constant current source 195, and the latter emitter junction to another constant current source 196. An output signal Vout is supplied from the common collector of the transistors 193 and 194 to a terminal 197. With the above structure, an offset is added to an output current and the linearity of an output signal can be improved as per the circuit of FIG. 23.

FIG. 25 illustrates a non-linear amplifier circuit according to a still further embodiment. A logarithm converter 110 comprises N-1 cascade-connected amplitude limiters 1101 to 110N-1, N emitter-connected transistor pairs 1201-120N, each constituted by emitter-connected first and second transistors Q1 and Q2, constant current sources 1301-130N respectively coupled to the emitter junctions of the transistor pairs 1201-120N, and first and second constant voltage sources 201 and 202.

An input video signal from an input terminal 101 is input to a low band eliminating filter 102. The output signal of this filter 102 is sequentially input to the amplitude limiters 1101 to 110N-1 and also to the base of the first transistor Q1 of the first emitter-connected transistor pair 1201. The base of the first transistor Q1 of each of the transistor pairs 1201-120N is supplied with the output signal of the associated one of the amplitude limiters 1101 to 110N-1. The base of the second transistor Q2 of each emitter-connected transistor pair is applied with a reference voltage Vref.

The collectors of the first transistors Q1 of the emitter-connected transistor pairs 1201-120N are commonly coupled to the first voltage source 201, which comprises a resistor R3 and a transistor Q3. The collectors of the second transistors Q2 of the transistor pairs 1201-120N are commonly coupled to the second voltage source 202, which comprises a resistor R4 and a transistor Q4.

The output terminal of this logarithm converter 110 serves as the collector of the transistor Q4 of the second constant voltage source 202, and a voltage signal proportional to a current flowing through the second constant voltage source 202 appears on this output terminal. This voltage signal is input to one input terminal of an adder 105 whose other input terminal is supplied with the input video signal. The adder 105 adds these two signals to produce an output video signal to an output terminal 106.

With the above structure, the relationship between the base-emitter voltage V BE of the transistors Q1 and Q2 of each emitter-connected transistor pair 1201-120N and a collector current Ic, i.e., the voltage-current characteristic is expressed as:

$$m \cdot V_{BE} = \ln(IC + I\,CES)/I\,CES$$

where
I CES: collector current when V BE=0,
m=q/kT,
q: electron charge,
k: Boltzmann's constant, and
T: absolute temperature.

In this case, one emitter-connected transistor pair has a logarithmic characteristic within an input signal amplitude range of about 15 dB.

Accordingly, the logarithm converter 110 generally presents a logarithmic characteristic with respect to an input signal of a very wide amplitude range by properly adjusting the amplitude of the input signals of the emitter-connected transistor pairs 1202-120N by means of the amplitude limiters 1101 to 110N-1 to thereby vary the amplitude changing range of the input signals of the transistor pairs.

Although FIG. 25 shows a feed-forward structure, a feedback structure may be employed in which, as in FIGS. 18 and 21, an output video signal to the output terminal 6 is input to the low band eliminating filter 2 and the output signal of the logarithm converter 10 is fed back to the adder 105.

Although the amplitude limiters 1101 to 110N-1 are cascade-connected in FIG. 25, the same results would of course be attained by connecting the amplitude limiters in parallel. It should be however noted that when the amplitude limiters are cascade-connected, they may have the same gain, but when they are connected in parallel, their gains should be changed in order to vary the amplitude ranges of the input signals of the emitter-connected transistor pairs.

According to the above embodiment, a signal attained by permitting an input video signal or an output video signal to pass through the low band eliminating filter and logarithm converter is synthesized with the input video signal to provide an output video signal. As a result, a non-linear characteristic even for a minute input signal amplitude can be attained and the S/N ratio can be significantly improved by increasing the amount of emphasis.

The logarithm converter does not require unnecessarily large input signal amplitude unlike the case where a diode clipper is used, thus suppressing the deterioration of the wave characteristic and reducing the source voltage.

Figure 26:
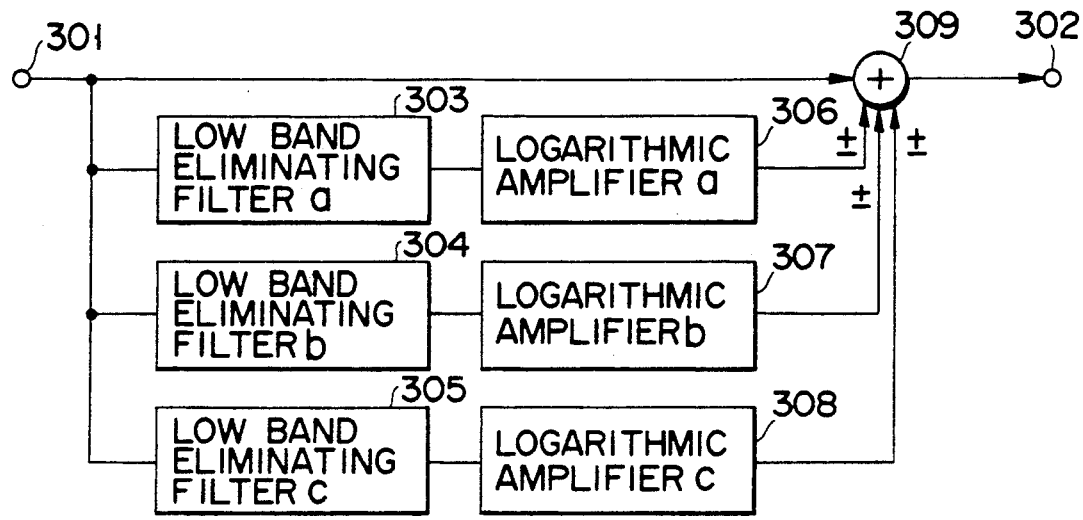
FIG. 26 is a block circuit diagram illustrating a non-linear amplifier circuit according to one embodiment.

Referring now to FIG. 26, a further embodiment will be described.

In recording data for a long period of time by means of a VTR, a guard band is not provided on a magnetic tap and recording is done using an azimuth loss. Accordingly, a crosstalk from an adjacent track occurs. According to this embodiment, however, a plurality of non-linear amplifier circuits constituted by a series circuit of a low band eliminating filter and a logarithmic amplifier are connected in parallel, thus reducing this crosstalk.

In the non-linear amplifier circuit shown in FIG. 26, a signal from an input terminal 301 is input to an adder 309 as well as to low band eliminating filters 303, 304 and 305. The output of the low band eliminating filter 303 is input to a logarithmic amplifier 306, and the outputs of the low band eliminating filters 304 and 305 are input to logarithmic amplifier 307 and 308, respectively. Although according to this embodiment, three low band eliminating filters are used, an arbitrary number of filters can be used as desired. The output signals of these logarithmic amplifiers 306-308 are input to an adder 309.

When the circuit of FIG. 26 is used as a non-linear emphasis circuit, the input signal and the output signals of the logarithmic amplifiers 306 to 308 are added by the adder 309. When the same circuit is used as a non-linear deemphasis circuit, the input signal and the output signals are subjected to subtraction by the adder 309.

Figure 27:
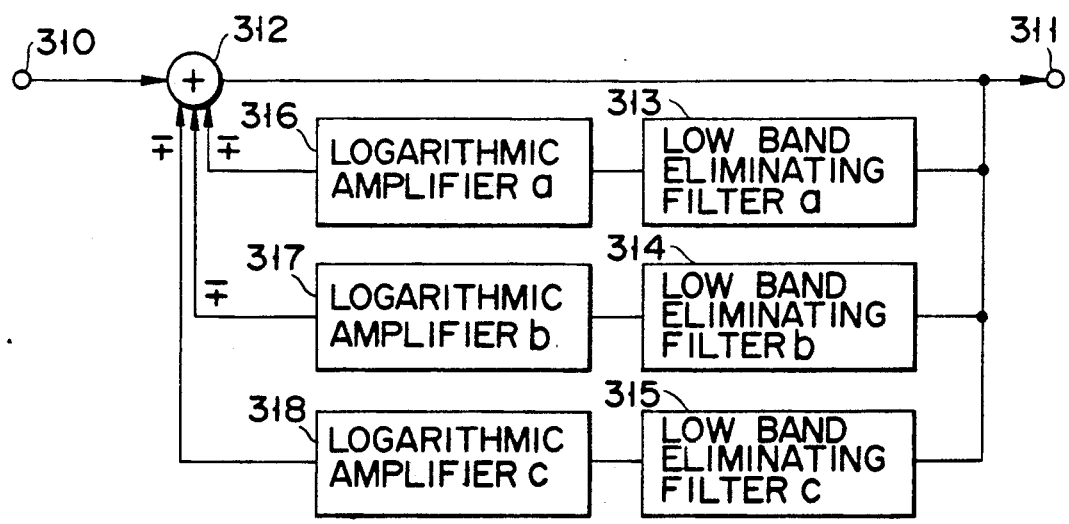
FIG. 27 is a block circuit diagram illustrating a non-linear amplifier circuit according to another embodiment.

FIG. 27 is a structural diagram illustrating a still further embodiment of a non-linear amplifier circuit to which the present invention is applied.

In this circuit, a signal from an input terminal 310 is input to an adder 312. The output signal of the adder 312 is supplied to a terminal 311 to be an output signal of a non-linear amplifier circuit and is also input to low band eliminating filters 313–315. The output terminal of the low band eliminating filter 313 is coupled to the input terminal of a logarithmic amplifier 316. Similarly, the output terminals of the low band eliminating filters 314 and 315 are respectively coupled to logarithmic amplifiers 317 and 318.

Although three low band eliminating filters are used in the above embodiment, more than three low band eliminating filters may be used. The output signals of the logarithmic amplifiers 316–318 are added to an adder 312.

When the circuit of FIG. 27 is used as a non-linear emphasis circuit, the adder 312 adds the signals output from the logarithmic amplifiers 316 to 318. In this case, a circuit using the adder 309 of the non-linear amplifier circuit shown in FIG. 26 as a subtracter, is used as a non-linear deemphasis circuit.

When the circuit of FIG. 27 is used as a non-linear deemphasis circuit, the adder 312 adds the output signals of the logarithmic amplifiers 316 to 318. In this case, a circuit using the adder 309 shown in FIG. 26 as an adder, is used as a non-linear emphasis circuit.

Figure 28:
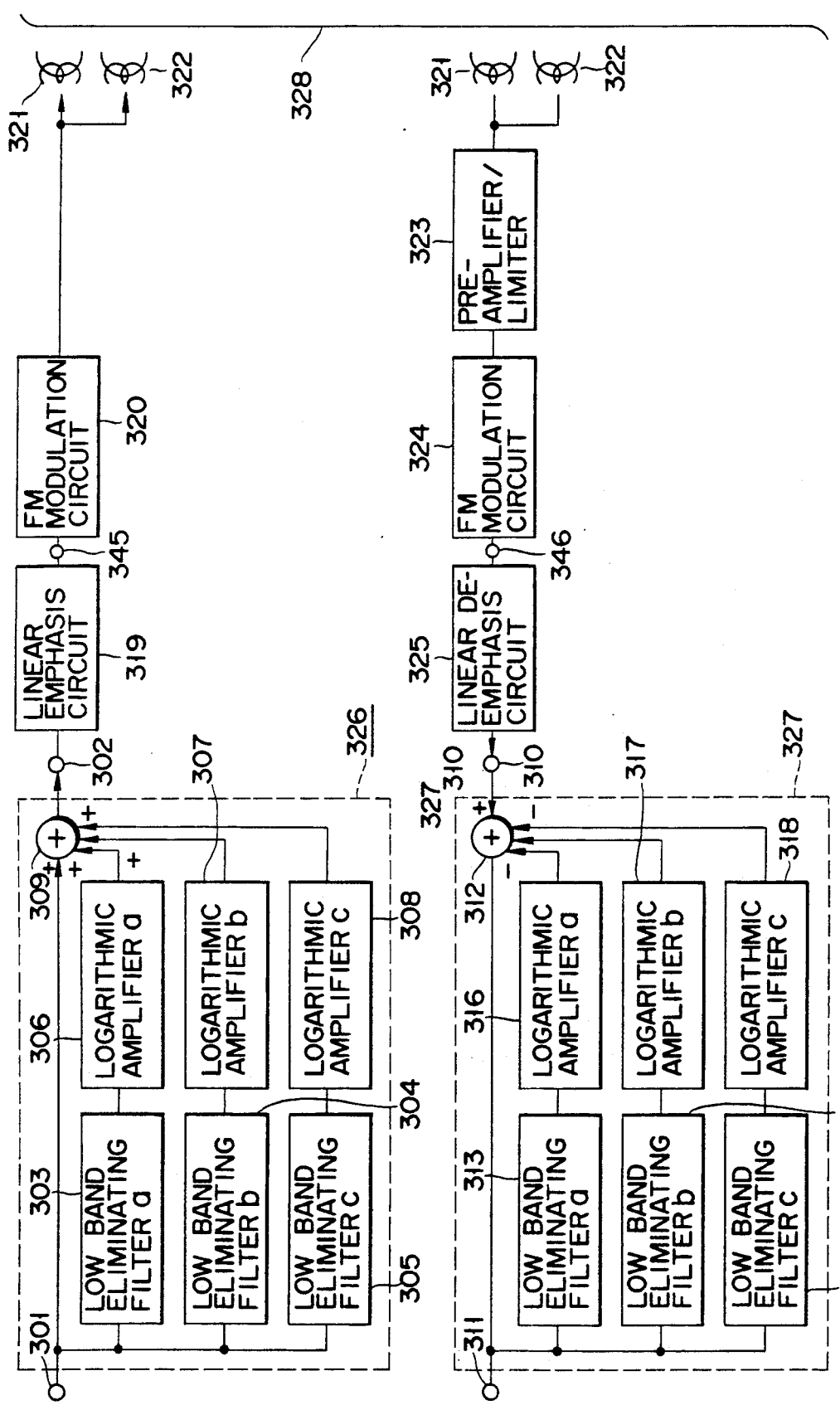
FIG. 28 is a block circuit diagram illustrating a non-linear amplifier circuit according to still another embodiment.
Figure 30:
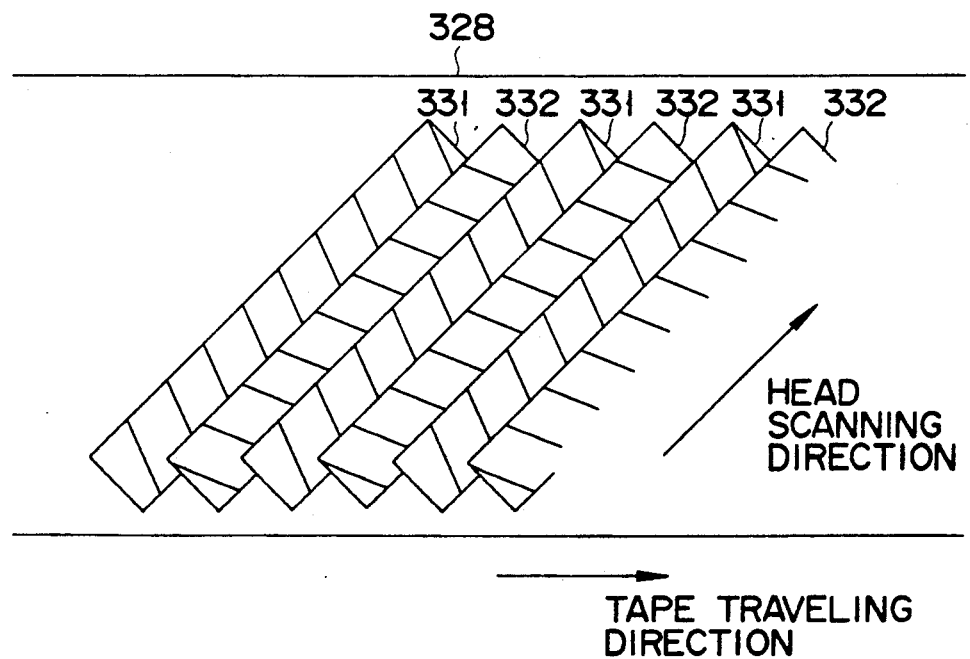
FIG. 30 shows a recording pattern of a magnetic tape.

FIG. 28 illustrates a recording/reproducing circuit in a case where the non-linear amplifier circuits shown in FIGS. 26 and 27 are employed in a VTR. A description referring to this diagram will be given of a case where a non-linear emphasis circuit 326 uses the adder 309 of FIG. 26 as an adder, and a non-linear deemphasis circuit 327 uses the adder 312 of FIG. 27 as a subtracter. An input signal is supplied from a terminal 301, and is recorded on a table using magnetic heads 321 and 322 after passing through the non-linear emphasis circuit 326, a linear emphasis circuit 319 and an FM modulation circuit 320. The tape 328 is wound obliquely around a rotary drum and a recording pattern as shown in FIG. 30 is formed on this tape.

Figure 29:
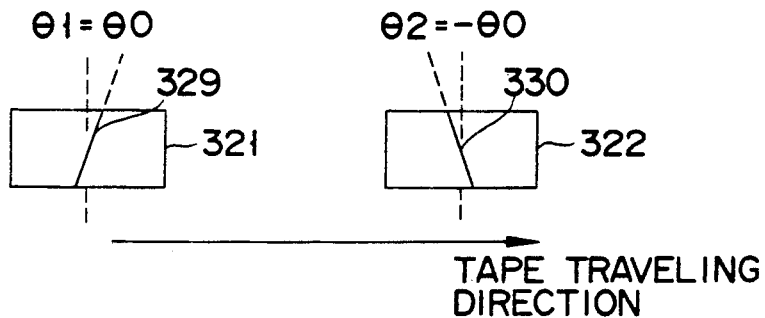
FIG. 29 is a diagram showing the azimuth of a magnetic head gap.

The magnetic heads 321 and 322 for recording a signal on the tape have head gaps 329 and 330 inclined in the opposite directions with respect to the direction normal to the tape traveling direction, as shown in FIG. 29. The recording pattern on the tape 328 is therefore inclined in the opposite directions on adjacent tracks 331 and 332. If such an inclined azimuth is provided, an azimuth loss L is given by the following equation.

$$L = 20 \log_{10} \left[ \frac{\frac{\pi \omega}{\lambda} \tan\theta 0}{\sin \frac{\pi \omega}{\lambda} \tan\theta 0} \right] (dB) \quad (32)$$

where $\omega$ is a track width, $\lambda$ is a recording wavelength and $\theta 0$ is an azimuth angle. Given that the amount of track deviation is d, the ratio of a reproduced signal S from the proper track to a undesirable reproduced signal D from an adjacent track is given by the following equation.

$$\frac{D}{S} = \frac{d}{\omega - d} \cdot \frac{\sin \frac{2\pi d}{\lambda} \tan\theta 0}{\frac{2\pi d}{\lambda} \tan\theta 0} \quad (33)$$

This indicates that the smaller the amount of the track deviation d as compared with the track width $\omega$ or the shorter the recording wavelength $\lambda$, the fewer the influence from an adjacent track.

Figure 31A:
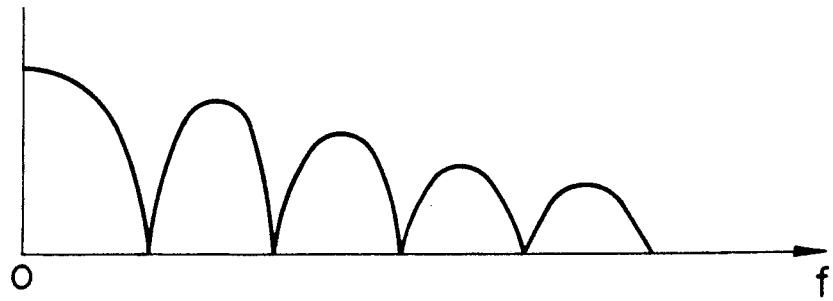
FIGS. 31A to 31D show patterns of noise distribution and frequency allocation.

That is, this equation indicates that a crosstalk noise is present on a reproduced signal as shown in FIG. 31A.

This crosstalk noise occurs when a recorded signal is reproduced from the tape 328 using the heads 321 and 322 shown in FIG. 29. The reproduced signal from the tape is demodulated by the FM demodulation circuit 324 through a pre-amplifier/limiter 323. The demodulated signal passes through a linear deemphasis circuit 325 and the logarithmic deemphasis circuit 327.

Figure 31B:
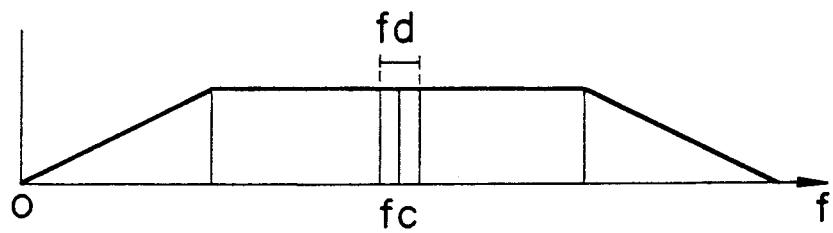
Figure 31C:
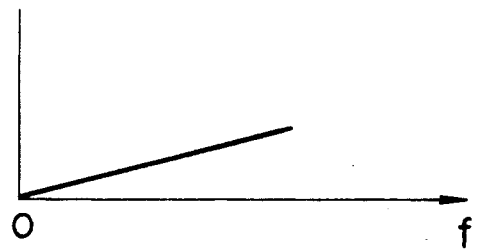
Figure 31D:
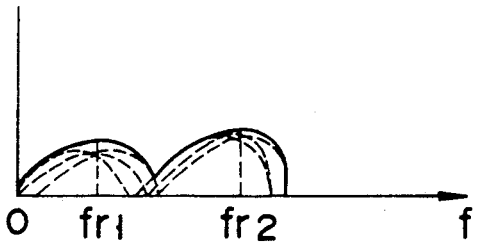

If the reproduced signal from the heads indicates a frequency allocation as shown in FIG. 31B, the crosstalk noise from the adjacent track after demodulation becomes as shown in FIG. 31D. This waveform is formed by envelopes of black level (high level) and white level (low level) waveforms indicated by the broken lines. The crosstalk noise of a reproduced signal using an azimuth loss can be suppressed by permitting the reproduced signal to pass through a filter having such a waveform characteristic.

Figure 32:
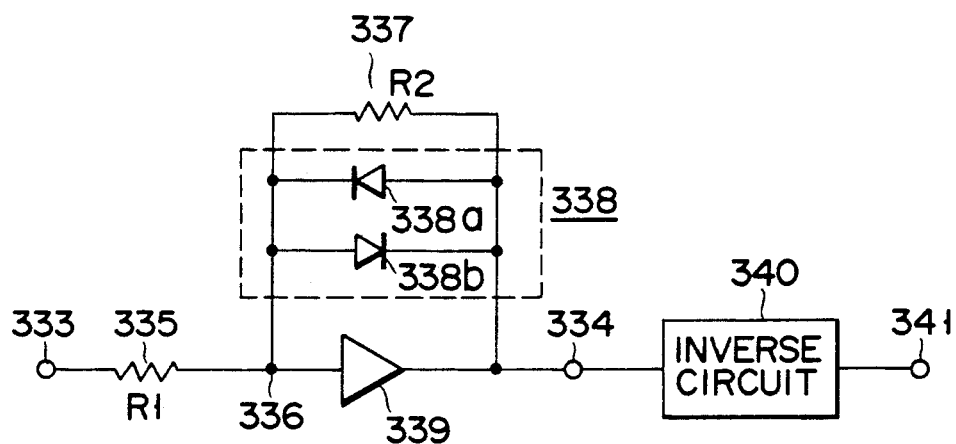
FIG. 32 is an example of a circuit diagram of a logarithmic amplifier which is used in the non-linear amplifier circuit of FIG. 28.
Figure 33:
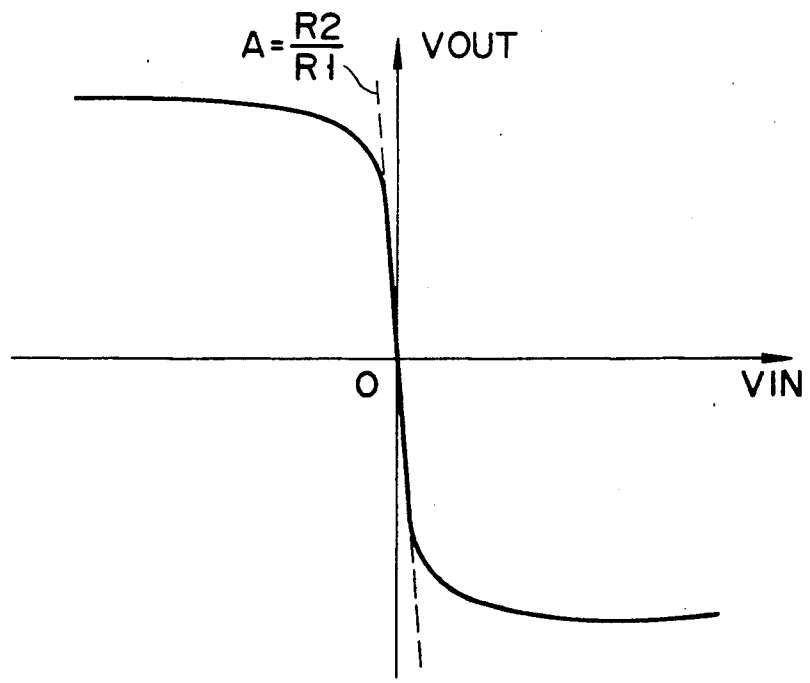
FIG. 33 shows a characteristic curve of the logarithmic amplifier illustrated in FIG. 32.

FIG. 32 exemplifies a logarithmic amplifier having an approximate logarithmic characteristic. Referring to this diagram, the output signal of a low band eliminating filter (for example, filter 303 or 313) is input to an input terminal 333. A terminal 336 is virtually grounded, and a current flowing across a resistor 335 having a resistance R1 flows across a resistor 337 having a resistance R2 and diodes 338a and 338b for attaining a logarithmic characteristic. An amplifier 339 having a high amplification factor is coupled in parallel to the resistors and diodes. An output having a logarithmic characteristic in both the positive and negative directions is obtained at the output terminal 334 of the logarithmic amplifier. An amplification factor for a minute level signal is expressed by A=R2/R1, and the logarithmic amplifier has the characteristic shown in FIG. 33. The output signal at the terminal 334 passes through an inverse circuit 340 and is output from a terminal 341. This output signal is input to the adder 309 or 312 shown in FIG. 28. When this adder is used as a subtracter, the inverse circuit 340 is of course unnecessary.

It is desirable that the logarithmic amplifiers 30 and 316 have the same characteristic, and similarly, the logarithmic amplifiers 307 and 317 and the logarithmic amplifiers 308 and 318 have the same characteristics, respectively.

Since the deemphasis circuit used here is a logarithmic amplifier, not a simple limiter using a diode, the amplification factor for a minute level signal can be set very high, thus eliminating the need to set the input amplitude of the deemphasis circuit excessively high.

FIG. 34 illustrates the structure of a low band eliminating filter or a high-pass filter (HPF). The low band eliminating filter 303 or 313 constituting a HPF comprises a capacitor 342 and a resistor 335, and a terminal 336 is a virtual ground terminal shown in FIG. 32.

This filter is provided for removing a triangular noise (see FIG. 31C) which occurs particularly when FM modulation/demodulation is executed.

FIG. 35 illustrates a low band eliminating filter 304, 314, 305 or 315 constituting a HPF which is provided for removing the crosstalk noise. This filter comprises a capacitor 343 having a capacitance C, a coil 344 with an inductance l and a resistor 335.

The resonance frequency $$fr = 1/2\pi \sqrt{LC}$$

at this time is set to a value so increase the crosstalk noise from an adjacent track. This produces a deemphasis effect not only to the triangular noise but also to a signal such as a crosstalk from an adjacent track.

Since the logarithmic deemphasis circuit used in this embodiment is designed such a way that elements for providing the emphasis characteristic and compression characteristic are connected in parallel, it is easy to attain the opposite characteristic to the characteristic of the non-linear emphasis circuit and the waveform characteristic will not be easily deteriorated. FIGS. 36 and 37 illustrate different embodiments to which the present non-linear amplifier circuit is applied. FIG. 36 illustrates the non-linear amplifier circuit of FIG. 26 used on the emphasis side, whereas FIG. 37 illustrates the non-linear amplifier circuit of FIG. 27 used on the deemphasis side.

According to the circuits shown in FIGS. 36 and 37, the linear emphasis circuit 319 and linear deemphasis circuit 325 in the recording/reproducing circuit shown in FIG. 28 are included in the non-linear amplifier circuit, thus simplifying the circuit configuration and contributing to cost reduction.

The operations of the above embodiments will now be described.

Figure 61A:
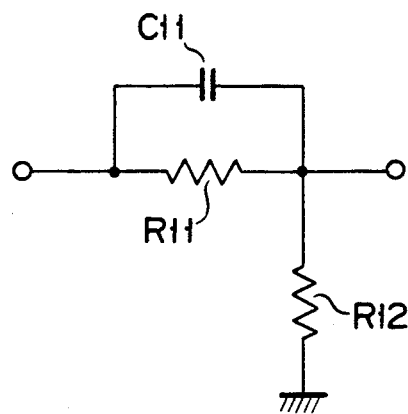
FIGS. 61A and 61B are circuit diagrams of prior art emphasis and deemphasis circuits.
Figure 61B:
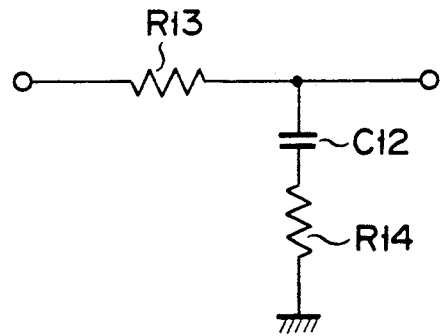

The emphasis and deemphasis transfer functions G EM(S) and G DM(S) in the prior art circuits shown in FIGS. 61A and 61B are expressed by the following equations (34) and (35).

$$G\ EM(S) = G'\ EM(S) \cdot G\ EM(S) \qquad (34)$$
$$= (1 + Ha(S) + Hb(S) + Hc(S)) \cdot \frac{R_{12}(1 + R_{11} C_{11} S)}{R_{11} + R_{12} + R_{11} \cdot R_{12} \cdot R_{11} S}$$

$$G\ DE(S) = G'\ DE(S) \cdot G\ DE(S) \qquad (35)$$
$$= \frac{1}{1 + Ha(S) + Hb(S) + Hc(S)} \cdot \frac{1 + R_{14} \cdot C_{12} \cdot S}{1 + C_{12} \cdot S(R_{13} + R_{14})}$$

An input signal to the emphasis circuit is supplied to the adder 309 through the input terminal 301 shown in FIG. 36 and to four low band eliminating filters 303–305 and 347. The output signals of the filters 303–305 are input to the logarithmic amplifiers 306–308 whose output signals are input to the adder 309. The output signal of the low band eliminating filter 34 is subjected to amplitude-multiplication by k by an amplitude adjuster 348 and the resultant signal is input to the adder 309. The output signal appearing at the output terminal 302 of this non-linear emphasis circuit is supplied through the terminal 345 of FIG. 28 to the FM modulation circuit 320 and recorded on the tape 328 by the magnetic heads 321 and 322. At the time of reproduction, the FM-modulated signal is output from the terminal 346 of the demodulation circuit 324, and is supplied through the terminal 310 of FIG. 37 to the adder 312.

The output signal of the adder 312 is input to four low band eliminating filters 313–315 and 349. The output signals of the filters 313–315 are input to the logarithmic amplifiers 316–318 whose output signals are input to the adder 312 for subtraction.

The output signal of the low band eliminating filter 349 is subjected to amplitude-multiplication by k by an amplitude adjuster 350 and the resultant signal is input to the adder 312 for subtraction. The output signal of this adder 312 is output from the terminal 311 as an output of this circuit.

Assuming that the input impedances of the amplitude adjusters 348 and 350 are sufficiently large, the low band eliminating filter 349 can be expressed as shown in FIG. 38 and the transfer function for the system including the amplitude adjusters too is expressed as follows:

$$F\ (S) = \frac{R_{15}C_{13}S}{1 + R_{15}C_{13}S} \cdot k \qquad (36)$$

The transfer function F EM(S) and F DE(S) of the non-linear emphasis circuit 351 and non-linear deemphasis circuit of this embodiment are expressed by the following equations.

$$F\ EM(S) = 1 + \frac{R_{15}C_{13}S}{1 + R_{15}C_{13}S} \cdot k + Ha\ (S) + Hb\ (S) + Hc\ (S) \qquad (37)$$

$$F\ DE(S) = \frac{1}{1 + \frac{R_{15}C_{13}S}{1 + R_{15}C_{13}S} \cdot k + Ha\ (S) + Hb\ (S) + Hc\ (S)} \qquad (38)$$

Let us now compare the equation (34) with the equation (37) and the equation (35) with the equation (38). Assuming Ha (S)=Hb (S)=Hc (S) due to fewer influence of Ha (S), Hb (S) and Hc (S) for a high-amplitude high frequency signal, then the equations (34) and (37) can be rewritten as:

$$G\ EM(S)m = \frac{R_{12} + R_{11}R_{12}C_{11}S}{R_{11} + R_{12} + R_{11}R_{12}C_{11}S} \qquad (39)$$
$$= \frac{S + \frac{1}{R_{11}C_{11}}}{S + \frac{R_{11} + R_{12}}{R_{11}R_{12} \cdot C_{11}}}$$

$$F\ EM(S)m = \frac{1 + (1 + k) R_{15}C_{13}S}{1 + R_{15}C_{13}S}$$
$$= (1 + k) \cdot \frac{S + \frac{1}{(1 + k) R_{15}C_{13}}}{S + \frac{1}{R_{15}C_{13}}}$$

It is thus possible to match the characteristics by properly selecting the values for $R_{15}$, $C_{13}$, k, etc. which present the characteristics shown in FIG. 39.

As described above, with the use of the above embodiment, the linear emphasis and non-linear emphasis can be constituted by a single circuit, thus contributing to cost reduction of the circuit.

This embodiment has the following advantages.

(1) It is possible to effectively reduce not only the triangular noise caused in the FM transmission system, but also noise increasing with a specific frequency, such as a crosstalk noise caused by an adjacent track, thus improving the S/N ratio. In a VTR, therefore, the recording density on a tape can be improved and a long recording can be ensured.

(2) By connecting in parallel those elements which determine the emphasis characteristic and compression characteristic, the characteristics of the non-linear emphasis circuit and non-linear deemphasis circuit can be made opposite to each other with high accuracy, thus reducing deterioration of a waveform as much as possible.

(3) By using a logarithmic element, which functions both in the positive and negative directions, as a compression circuit, the signal amplitude to be treated within the non-linear emphasis circuit and non-linear deemphasis circuit can be reduced and the source voltage can be reduced.

A further embodiment will be described below referring to FIG. 40.

The use of a non-linear emphasis/deemphasis circuit may cause a high-order higher harmonic generated in the non-linear deemphasis circuit to be mixed in the final output and deteriorates the waveform as a consequence. This embodiment provides a video signal transfer apparatus and a video signal restoring apparatus which prevents such a high-order higher harmonic generated in a non-linear emphasis/deemphasis process from being mixed in the final output irrespective of the band restriction by an FM demodulation circuit.

The video signal transfer apparatus of this embodiment basically comprises a first apparatus for sending a video signal to a transfer system through a non-linear emphasis circuit and an FM modulation circuit, and a second apparatus for restoring a video signal by permitting the FM signal supplied via the transfer system to pass through an FM demodulation circuit, a non-linear emphasis circuit and a low-pass filter. The low-pass filter is inserted on the output side of the non-linear deemphasis circuit.

Figure 47A:
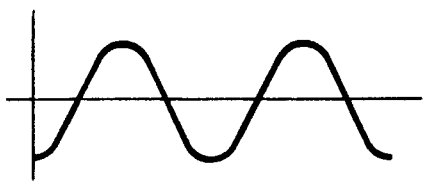
FIGS. 47A to 54B illustrate signal waveforms and frequency spectrums in various circuit portions of the video recording/reproducing apparatus shown in FIG. 40.
Figure 47B:
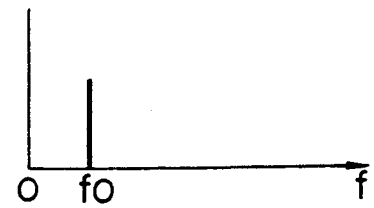

According to a video image recording/reproducing apparatus (VTR) shown in FIG. 40, an input terminal 401 is supplied with an input video signal of a frequency band f0 as shown in, for example, FIGS. 47A and 47B. If the input video signal is a high definition video signal, f0 is 12 MHz, for example. This input video signal is input to a non-linear emphasis circuit 402.

This circuit 402 emphasizes the high frequency component of the input video signal in accordance with the amount of emphasis corresponding to the signal amplitude, and is designed as illustrated in FIG. 41 or 42, for example. FIG. 41 illustrates a circuit with a feed-forward structure in which a video signal input to an input terminal 421 is supplied to one input terminal of an adder 424 through a low band eliminating filter 422 and a compression circuit 423. The input video signal is directly supplied to the other input terminal of the adder 424. The output signal of the adder 424 is sent to an output terminal 425. FIG. 42 illustrates a circuit with a feedback structure in which a video signal input to an input terminal 421 is supplied to one input terminal of an adder 424. The output signal of the adder 424 is sent to the output terminal 425 as well as to the other input terminal of the adder 424 through the low band eliminating filter 422 and compression circuit 423.

Figure 48A:
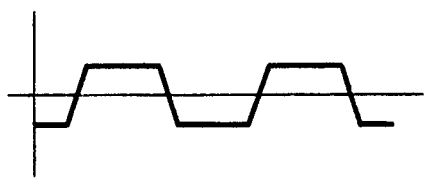
Figure 48B:
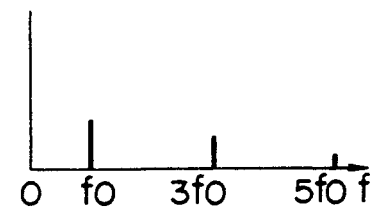
Figure 49A:
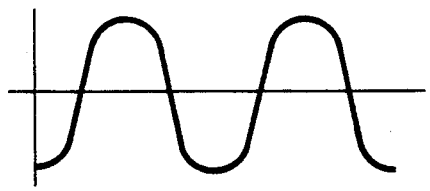
Figure 49B:
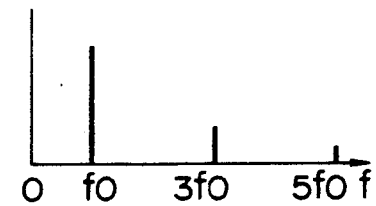

The compression circuit 423 has an input/output characteristic as shown in, for example, FIG. 43; its output is illustrated in FIGS. 48A and 48B. For example, an amplitude limiter or a logarithmic amplifier may be used as the compression circuit 423. As shown in FIGS. 48A and 48B, the output of the compression circuit 423 contains a high-order higher harmonic (particularly, an odd-numbered order higher harmonic). As shown in FIGS. 49A and 49B, this higher harmonic appears on the output of the non-linear emphasis circuit 402, for example, the output of the adder 424 shown in FIG. 41. The energy of the high-order higher harmonic increases as the amount of emphasis of the non-linear emphasis circuit 402 increases.

The output signal of the non-linear emphasis circuit 402 is input to an FM modulation circuit 404 through a linear emphasis circuit 403 having a constant amount of emphasis irrespective of the signal amplitude. After FM-modulated there to be suitable for recording, the FM signal is recorded on a magnetic tape 406 by a recording head 405.

The FM signal recorded on the magnetic tape 406 is reproduced on the reproduction side (second apparatus) by a reproducing head 407. A single magnetic head may be commonly used as the recording head 405 and reproducing head 407. The FM signal reproduced by the reproducing head 407 is subjected to amplification and amplitude limiting by a pre-amplifier/limiter 408, then it is demodulated by an FM demodulation circuit 409.

Figure 51A:
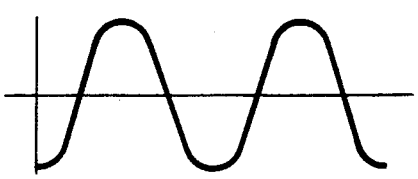
Figure 51B:
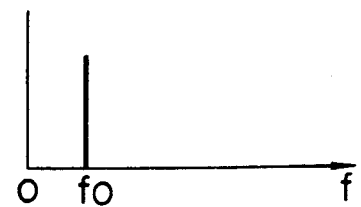
Figure 52A:
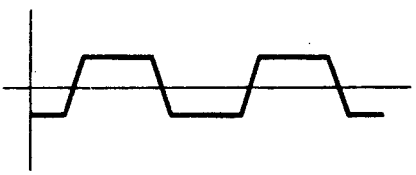
Figure 52B:
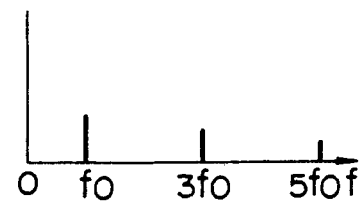
Figure 53A:
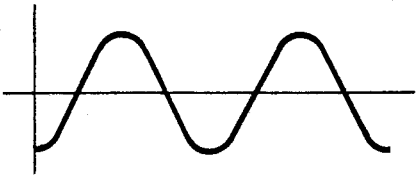
Figure 53B:
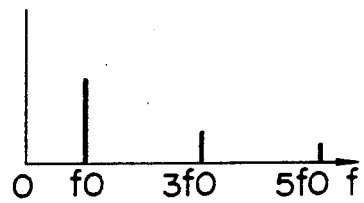

FIG. 46 exemplifies the FM demodulation circuit 409. According to this FM demodulation circuit in FIG. 46, a video signal supplied to an input terminal 441 is given to one input terminal of an EOR (Exclusive OR) circuit 443 via a delay line 442 and is directly given to the other input terminal of the EOR circuit 443. The output of the EOR circuit 443 is sent to an output terminal 445 through a low-pass filter (LPF) 444. This circuit is known as a delay type FM demodulation circuit and is typically used in a VTR. Alternatively, a pulse count type FM demodulation circuit or the like may be used. With the use of such FM demodulation circuit 409, a high-order higher harmonic component present on the output of the adder 24 (output of the non-linear emphasis circuit 402) as shown in FIGS. 49A and 49B will not appear on the output of the LPF 444 (see FIGS. 51A and 51B) due to the band restriction by the LPF 444 as shown in FIG. 51B.

Referring back to FIG. 40, the video signal demodulated by the FM demodulation circuit 409 is input to a non-linear deemphasis circuit 411 through a linear deemphasis circuit 410, which has a constant amount of deemphasis irrespective of the signal amplitude. The circuit 411 suppresses a high frequency component of the input video signal in accordance with the amount of deemphasis corresponding to the signal amplitude, and has the structure as shown in FIG. 44 or 45, for example. FIG. 44 illustrates a circuit with a feedback structure in which a video signal input to an input terminal 431 is supplied to one input terminal of an adder 434. The output signal of the adder 434 is sent to an output terminal 435 as well as to the other input terminal of the adder 434 through a low band eliminating filter 432 and compression circuit 433. FIG. 44 illustrates a circuit with a feed-forward structure in which a video signal input to the input terminal 431 is supplied to one input terminal of the adder 434 through the low band eliminating filter 432 and the compression circuit 433. The input video signal is directly supplied to the other input terminal of the adder 434. The output signal of the adder 434 is sent to the output terminal 435.

If the circuit with the feed-forward structure shown in FIG. 41 is used for the non-linear emphasis circuit 402, the circuit with the feedback structure shown in FIG. 44 is used for the non-linear deemphasis circuit 411. On the other hand, if the circuit with the feedback structure shown in FIG. 42 is used for the non-linear emphasis circuit 402, the circuit with the feed-forward structure shown in FIG. 45 is used for the non-linear deemphasis circuit 411. Accordingly, the characteristic of the non-linear emphasis circuit 402 and the characteristic of the non-linear deemphasis circuit 411 have a mutually compensating relationship.

Figure 50:
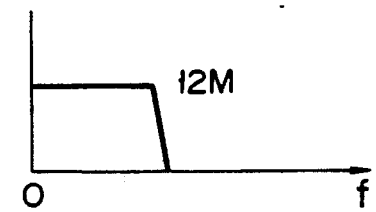
Figure 54A:
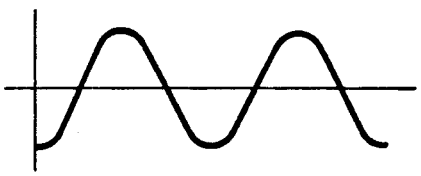
Figure 54B:
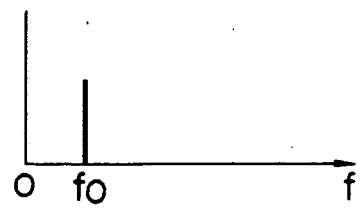

According to this invention, the output of the non-liner deemphasis circuit 411 is input to a LPF 412 where the high-order higher harmonic component generated in the non-linear deemphasis circuit 411 is removed as shown in FIGS. 54A and 54B. The resultant signal is then supplied to an output terminal 413. It is desirable that the passing band of the LPF 412 is the same as that of the LP 444 in the Fm demodulation circuit 409 shown in FIG. 50B. This is because that, of the high-order higher harmonics generated in the non-linear emphasis circuit 402, the component which is transferred through a path from the linear emphasis circuit 403, FM modulation circuit 404, recording head 405, magnetic tape 406, reproducing head 407, pre-amplifier/limiter 408, FM demodulation circuit 409 and linear deemphasis circuit 410, is canceled out by the non-linear deemphasis circuit 41 and the component which has not been transferred is attenuated by the LPF 412.

Figure 55:
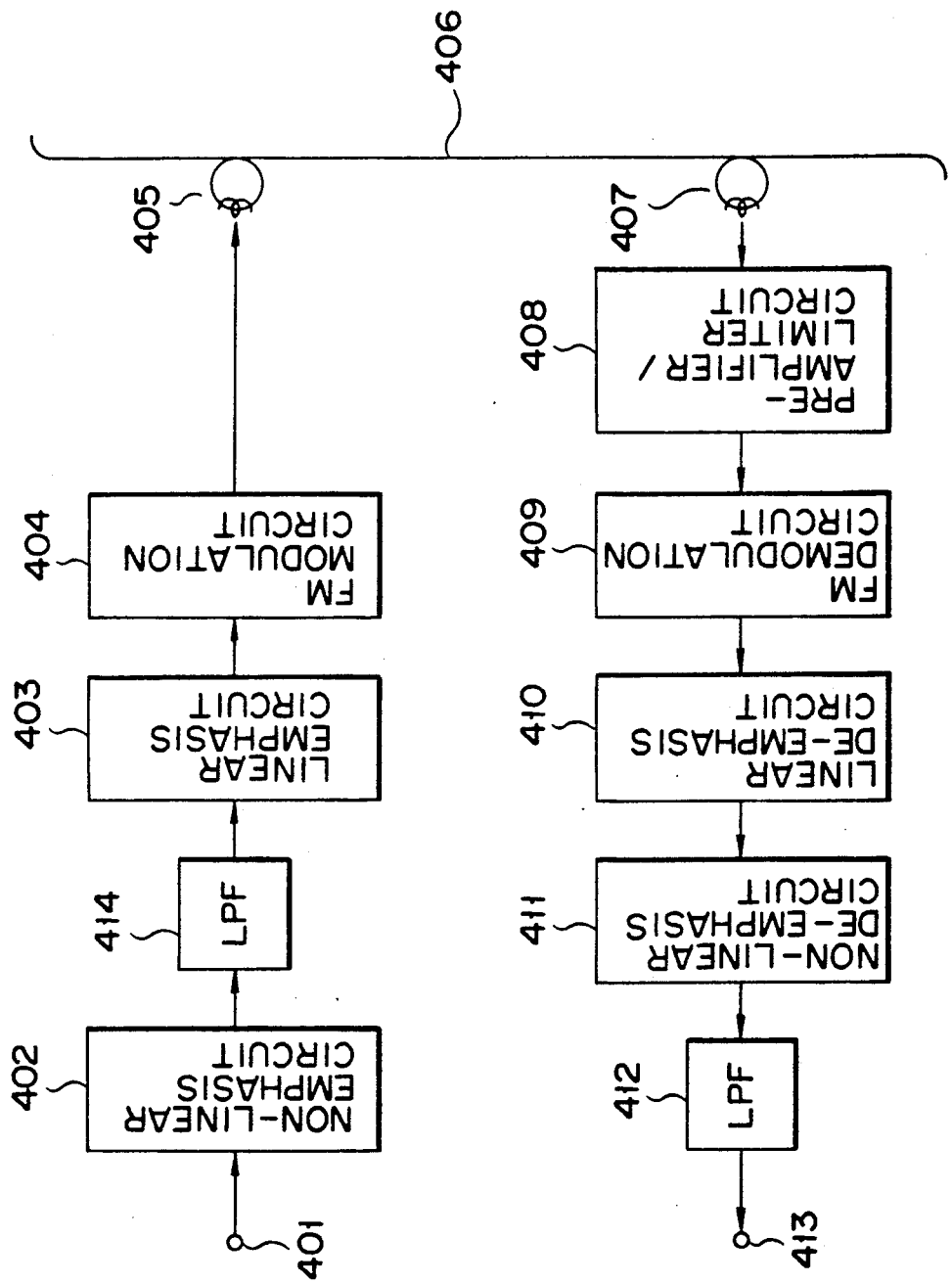
FIG. 55 is a block circuit diagram of a video recording/reproducing apparatus according to another embodiment.

FIG. 55 illustrates a still further embodiment which differs from the previous embodiment in that the LPF 414 is inserted between the non-linear deemphasis circuit 402 and linear emphasis circuit 403 on the recording side. The function of the LPF 414 is as follows:

The output signal of the non-linear emphasis circuit 402 contains an odd-numbered order higher harmonic component as shown in FIG. 49B. If the output signal of the circuit 402 is supplied through the linear emphasis circuit 403 to the FM modulation circuit 404 for FM modulation, A side band wave of the FM signal originated from this higher harmonic component will be generated. The influence of this side band wave does not raise any problem when a carrier frequency in the FM modulation circuit 404 is high, but it will cause moire when the carrier frequency is low as in the case of a VTR. The amount of moire is determined by the amount of emphasis of the non-linear emphasis circuit 402, the carrier frequency of the FM modulation circuit 404, the amount of frequency deviation, the type of the circuits, and the like.

With the use of a conventionally typical multi-vibrator type FM modulation circuit, the frequency spectrum of its output shows that the returning component of a lower side band wave and a lower side band wave component of the third higher harmonic cause moire (see FIG. 56). The output signal of the non-linear emphasis circuit 402 is a composite wave of the reference wave component and an odd-numbered order higher harmonic. Generally, when FM modulation is performed using a composite wave of two frequency components, the resultant FM wave is the reference wave and side band wave of the FM wave resulting from FM modulation using one frequency component, which are FM-modulated using the other frequency component.

Assume that the output signal of the non-linear emphasis circuit 40 consists of a reference wave and third higher harmonic and modulation index is small. In this case, inserting the non-linear emphasis circuit 402 significantly increases the third higher harmonic component, so that the third lower side band wave present as a returning component and the third side band wave of the third higher harmonic of the FM wave (both shown in FIG. 57) get in the transmission band of the FM wave. This increases the amount of moire.

If the LPF 414 is inserted on the output side of the non-linear emphasis circuit 402 as shown in FIG. 55, the high-order higher harmonic component at a high frequency is reduced. This significantly reduces the amount of moire and makes it possible to provide the characteristic shown in FIG. 56 which is attained by executing FM modulation without involving the non-linear emphasis circuit 402. The characteristic of the LPF 414 needs only to be set so as to avoid any problem raised by the amount of moire.

Figure 58:
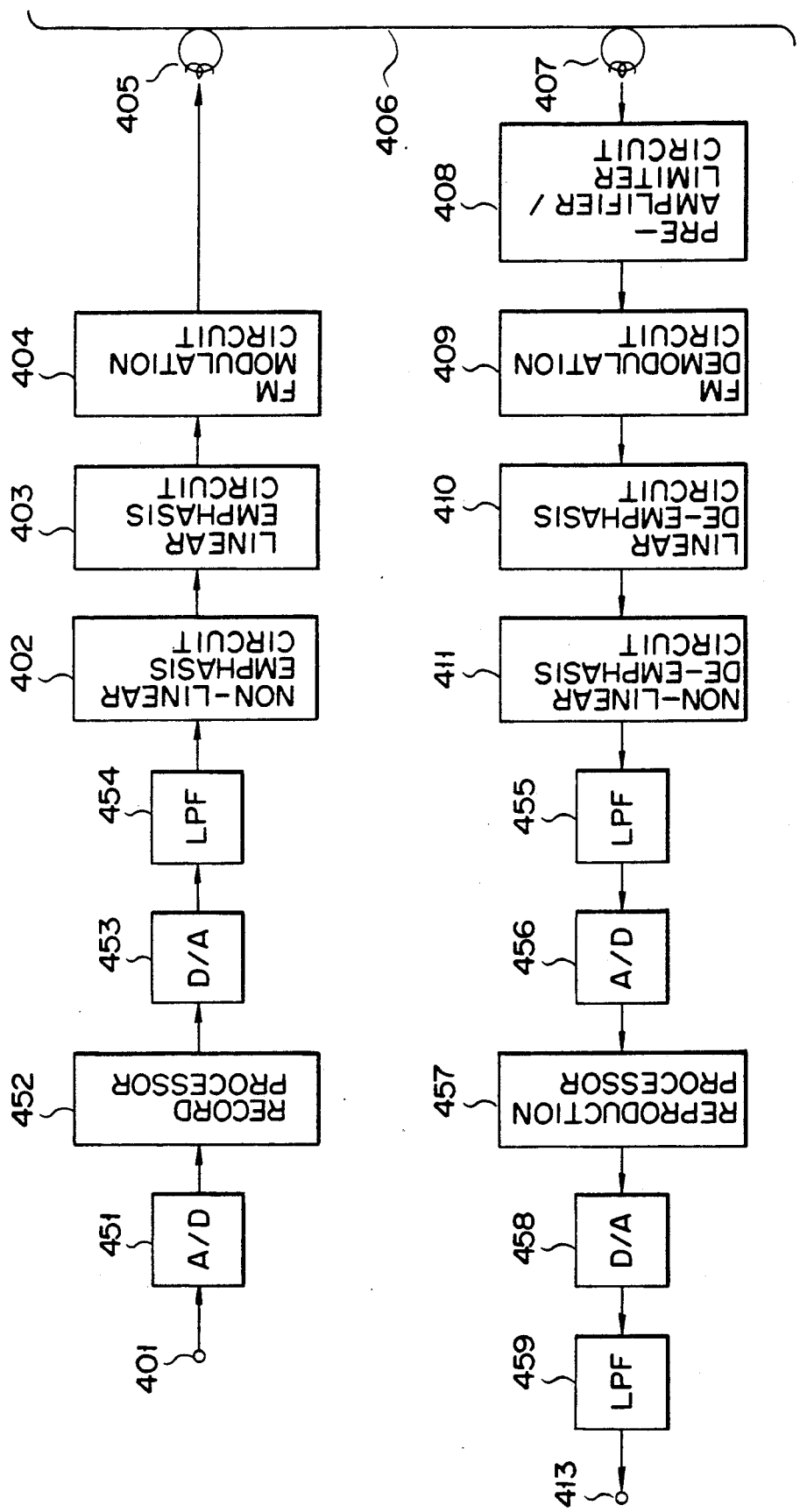
FIGS. 58, 59, and 60 are block circuit diagrams of various video recording/reproducing apparatuses.

FIG. 58 illustrates a still further embodiment. An input video signal, which consists of an Y signal (luminance signal) in a band of f0=20 MHz and a C signal (color signal) in a band of f0=8 MHz, for example, is supplied to an input terminal 401. This input video signal is sampled at a sampling frequency of 27 MHz, for example, by a first A/D converter 451, and converted into a digital signal with the proper number of bits. This digital signal is then input to a record processor 452 serving as a first digital processor. This record processor 452 executes a predetermined process on the digitized input video signal. For example, the record processor 452 converts the input video signal into a TCI (Time Compressed Integration) signal with two channels and a band of f0=12 MHz in order to facilitate recording of the signal onto a magnetic tape 406. The output of the record processor 452 is converted into an analog signal by a first D/A converter 453, is smoothed by a first LPF 454, is then recorded on the magnetic tape 406 by a recording head 405 through a non-linear emphasis circuit 402, linear emphasis circuit 403 and FM modulation circuit 404.

An FM signal reproduced from the magnetic tape 406 by a reproducing head 407 passes through a pre-amplifier/limiter 408, FM demodulation circuit 409, linear deemphasis circuit 410, non-linear deemphasis circuit 411 and second LPF 455, then is converted into a digital signal by a second A/D converter 456. This digital signal is then subjected, by a reproduction processor 457 serving as a second digital processor, to a process opposite the one done by the reproduction processor 457. This process separates the TCI signal into the Y signal and C signal. The output of the reproduction processor 457 is converted into an analog signal by a D/A converter 458 and then supplied to an output terminal 413 after being smoothed by a third LPF 459.

The second LPF 455 is basically a filter, like the LPF 412 in the previous embodiment, for removing a high-order higher harmonic component generated in the non-linear deemphasis circuit 411. This LPF 455 however need not have the same characteristic as the LPF 444 (see FIG. 46) in the FM demodulation circuit 409, but has only to satisfy the following two conditions:

(1) The passing band is f0.

(2) Given that the sampling frequency in the second A/D converter 456 is fS (e.g., fS=27 MHz) for suppressing a return noise in the A/D converter 456, the high-order higher harmonic component of the output signal of the non-linear deemphasis circuit 411 is attenuated sufficiently by the frequency fS-f0.

In this case, the high-order higher harmonic component generated in the non-linear deemphasis circuit 411 will not be completely removed by the LPF 455 alone. That portion which cannot be removed by the LPF 455 can be completely eliminated by a third LPF 459. Given with the above characteristic, the second LPF 455 can have a relatively gentle cut-off characteristic as compared with the LPF 412 used in the previous embodiment, thus contributing to cost reduction.

Figure 59:
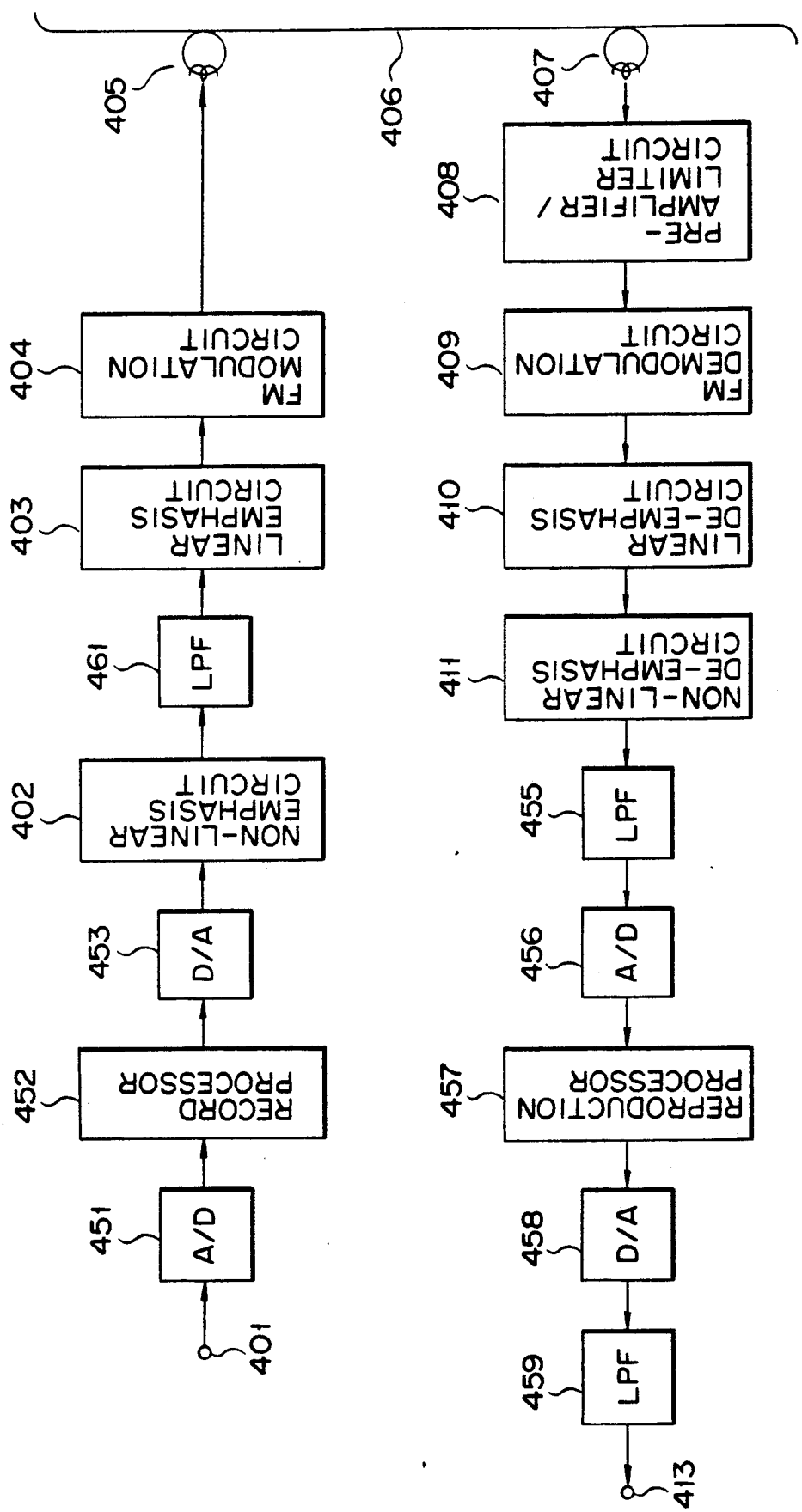

FIG. 59 illustrates a still further embodiment in which the first LPF 454 shown in FIG. 58 is eliminated and a first LPF 461 is inserted instead between the non-linear emphasis circuit 402 and linear emphasis circuit 403. This LPF 461 has the functions of both the first LPF 414 in the embodiment of FIG. 55 and the first LPF 454 in the embodiment of FIG. 58, thus further contributing to cost reduction.

Figure 60:
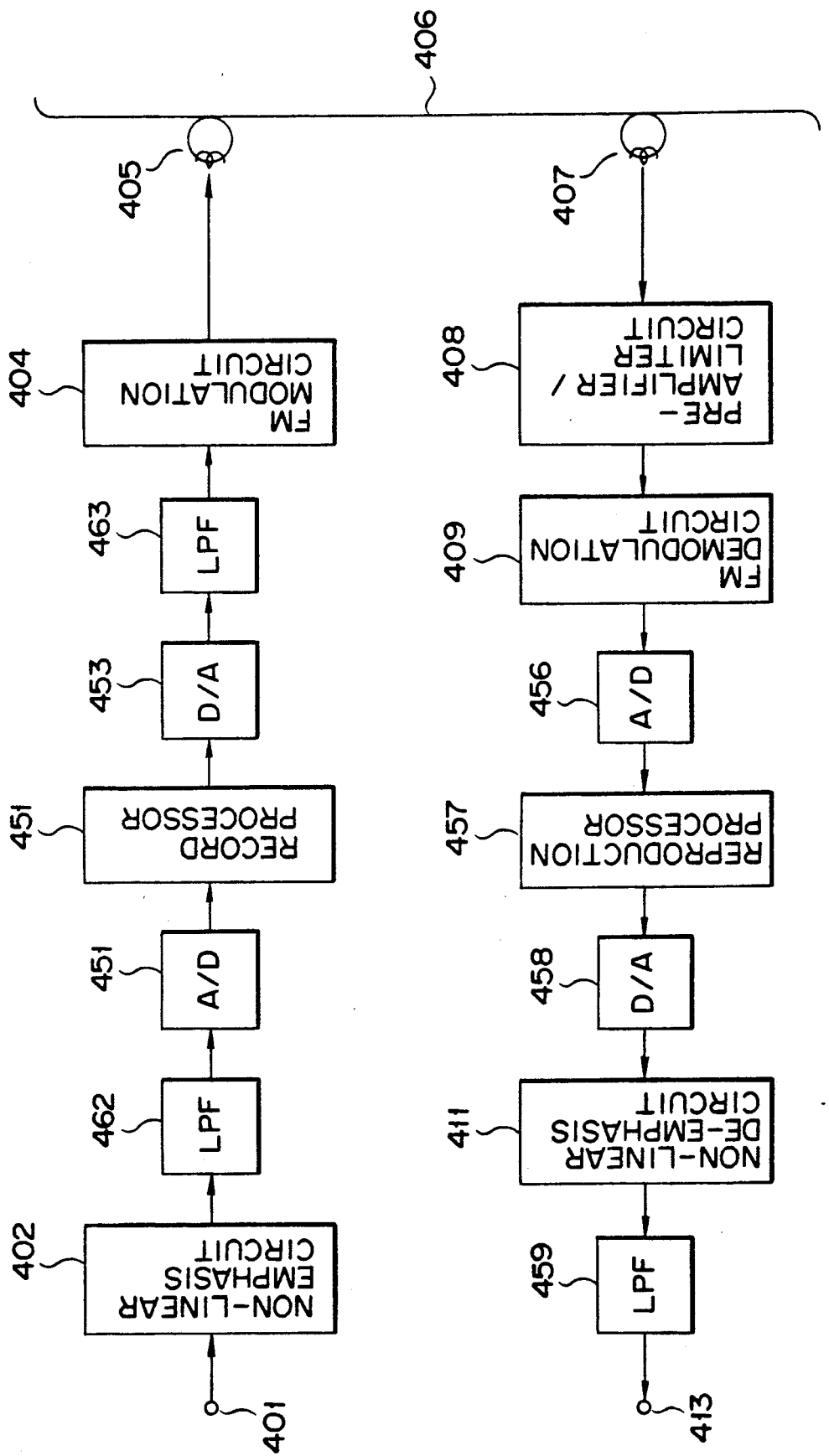

FIG. 60 illustrates a still further embodiment according to which an input video signal supplied to an input terminal 401 passes through a non-linear emphasis circuit 402 first, and is then input to a first A/D converter 451 via a first LPF 462 to be a digital signal. This digital signal is converted into, for example a TCI signal by a record processor 452, then recorded on a magnetic tape 406 by a recording head 405, passing through a D/A converter 453, a second LPF 463 (corresponding to the LPF 454 in FIG. 58) and an FM modulation circuit 404.

An FM signal reproduced from the magnetic tape 406 by a reproducing head 407 is converted into a digital signal after passing through a pre-amplifier/limiter 408 and an FM demodulation circuit 409. The resultant signal is separated into the Y signal and C signal by a reproduction processor 457 and these signals are supplied to an output terminal 413 through a D/A converter 458, a non-linear deemphasis circuit 411 and a third LPF 459.

The non-linear emphasis circuit 402 has such a characteristic that the amount of emphasis is small when the signal amplitude is high and increases when it is low. That is, when the amplitude of the input signal is high, the amplitude of the output signal slightly increases as compared with the case where the input signal amplitude is low. If the output of the non-linear emphasis circuit 402 is input to the A/D converter 451 through the LPF 462, therefore, the dynamic range of the input signal of the A/D converter 451 is compressed. This ensures an effective use of the dynamic range of the A/D converter 451 (rang of the level of the input signal subjectable to A/D conversion).

As well known, quantization noise occurs in the process of A/D conversion and D/A conversion. If the non-linear emphasis circuit 402 is inserted at the subsequent stage of the A/D converter 451 and D/A converter 453, as shown in FIGS. 58 and 59, the triangular noise originating from FM modulation can be suppressed but the quantization noise cannot be suppressed.

In contrast, according to the embodiment of FIG. 60, the non-linear emphasis circuit 402 is provided at the preceding stage of the A/D converter 451 and D/A converter 453, a high frequency component of a minute amplitude signal is emphasized before being supplied to the A/D converter 451. This will result in an expected effect of suppressing the quantization noise too by the non-linear emphasis circuit 402. If the structure of this embodiment is applied to a VTR, therefore, even dubbing is repeated a number of times, a high-quality reproduced image can be attained with less signal deterioration caused by the quantization noise.

Although the foregoing descriptions of the embodiments have been given with reference to a VTR, the present invention can apply to signal transmission/reception of a television signal, as well as a reproduction-only apparatus such as a video disk player or a television receiver.

According to the present invention, a high-order higher harmonic generated in a non-linear deemphasis circuit is prevented from being mixed with the final output, and wave distortion can be significantly reduced, thus providing an excellent reproduced image.

According to the above-described embodiments, although a high-order higher harmonic generated in a non-linear emphasis circuit is eliminated by the band restriction performed by an FM demodulation circuit, a high-order higher harmonic generated in the non-linear deemphasis circuit will not be canceled out with the former high-order higher harmonic and thus appears on the output of the non-linear deemphasis circuit. As a low-pass filter is provided on the output side of the non-linear deemphasis circuit, however, this high-order higher harmonic will not be mixed with the final output. This reduces wave deterioration of a video signal restored on the reproduction side or receiving side, thus improving the quality of a reproduced image.

What is claimed is:

1. A non-linear amplifier circuit comprising:
    low band eliminating filter means for receiving an input signal and outputting an output signal obtained by removing a low frequency signal from said input signal;
    logarithmic amplifier means for receiving said output signal of said low band eliminating filter means and outputting an output signal, said logarithmic amplifier means including an amplifier having an input terminal and an output terminal, and a bidirectional logarithmic element and a resistor which are coupled in parallel between said input and output terminals of said amplifier; .
    adder means for adding said output signal of said logarithmic amplifier means and said input signal with a predetermined polarity relationship and outputting an output signal; and
    a delay element provided in a path of said low band eliminating filter means, said logarithmic amplifier means and said adder means.

2. A non-linear amplifier circuit according to claim 1, wherein said adder means comprises an adder for outputting said output signal to said low band eliminating filter means and an output terminal.

3. A non-linear amplifier circuit according to claim 1, wherein said bidirectional logarithmic element comprises a plurality of diodes coupled in parallel in reverse bias directions.

4. A non-linear amplifier circuit according to claim 1, wherein said bidirectional logarithmic element comprises a plurality of transistors each having a collector and a base coupled together and having base-emitter paths coupled in mutually reverse directions.

5. A non-linear amplifier circuit according to claim 1, wherein said bidirectional logarithmic element comprises a plurality of transistors having base-emitter paths coupled in reverse directions and each having a base grounded.

6. A non-linear amplifier circuit according to claim 1, wherein said low band eliminating filter means comprises a filter for outputting said output signal thereof as a current signal to said logarithmic amplifier means.

7. A non-linear amplifier circuit according to claim 1, wherein said low band eliminating filter means comprises a filter for outputting said output signal thereof as a voltage signal to said logarithmic amplifier means.

8. A non-linear amplifier circuit comprising:
  a low band eliminating filter for receiving an input signal from an input terminal and for eliminating low frequency components from the input signal to output a first output signal;
  an emphasis circuit receiving the first output signal from said low band eliminating filter and outputting a second output signal;
  an adder for adding the second output signal from said emphasis circuit and the input signal with a predetermined polarity relationship and outputting a third output signal obtained by the addition to an output terminal; and
  at least one delay element provided in a path from said input terminal to said adder through said low band eliminating filter and said emphasis circuit.

* * * * *